US005885752A

United States Patent [19]

Itou et al.

[11] Patent Number: 5,885,752

[45] Date of Patent: *Mar. 23, 1999

[54] METHOD OF MANUFACTURING DISPLAY SCREEN

[75] Inventors: Takeo Itou, Kumagaya; Hidemi Matsuda, Fukaya; Hisashi Chigusa, Urawa; Kazuo Sakai, Kawanishi; Masaru Fukuda, Osaka, all of Japan

[73] Assignees: Kabushiki Kaisha Toshiba, Kawasaki; Fuji Pigment Co., Ltd., Kawanishi, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 574,978

[22] Filed: Dec. 19, 1995

[30] Foreign Application Priority Data

| | | | |
|---|---|---|---|
| Dec. 19, 1994 | [JP] | Japan | 6-315058 |
| Dec. 19, 1994 | [JP] | Japan | 6-315059 |

[51] Int. Cl.[6] ........ G03C 5/00; G03F 9/00

[52] U.S. Cl. ........ 430/320; 430/7; 430/321; 430/28; 430/29

[58] Field of Search ........ 430/28, 29, 289, 430/7, 320, 325, 326, 321; 427/68

[56] References Cited

U.S. PATENT DOCUMENTS

| | | | |
|---|---|---|---|
| 2,959,483 | 11/1960 | Kaplan | 96/34 |
| 3,114,065 | 12/1963 | Kaplan | 313/92 |
| 4,311,773 | 1/1982 | Kaneko et al. | 430/7 |
| 5,334,468 | 8/1994 | Yamasita et al. | 430/7 |
| 5,340,673 | 8/1994 | Tateyama et al. | 430/23 |

FOREIGN PATENT DOCUMENTS

| | | |
|---|---|---|
| 36 11 875 | 10/1987 | Germany . |
| 52-77578 | 6/1977 | Japan . |
| 77-077578 | 6/1977 | Japan . |
| 53-45165 | 4/1978 | Japan . |
| 59-0129329 | 12/1984 | Japan . |
| 64-7457 | 1/1989 | Japan . |
| 1074286 | 3/1989 | Japan . |
| 5-266795 | 10/1993 | Japan . |

OTHER PUBLICATIONS

English Abstract of SU 1492706 (two abstracts), Oct. 1992.

DeForest, W.S., Photoresist, Materials and Methods, McGraw–Hill, NY, 1975, p. 199.

*Primary Examiner*—John A. McPherson
*Assistant Examiner*—Rosemary Ashton
*Attorney, Agent, or Firm*—Pillsbury Madison & Sutro LLP

[57] ABSTRACT

There is disclosed a salt of a polymer having charged anionic functionalities used as a dispersant in a dispersion solution containing a pigment and used for forming a first pigment layer. A substance which forms a salt with a polymer having charged anionic functionalities is mixed into a solution applied on the pigment layer, and/or mixed into a developing solution. The formed layers are patterned and thus a display screen is obtained.

9 Claims, 5 Drawing Sheets

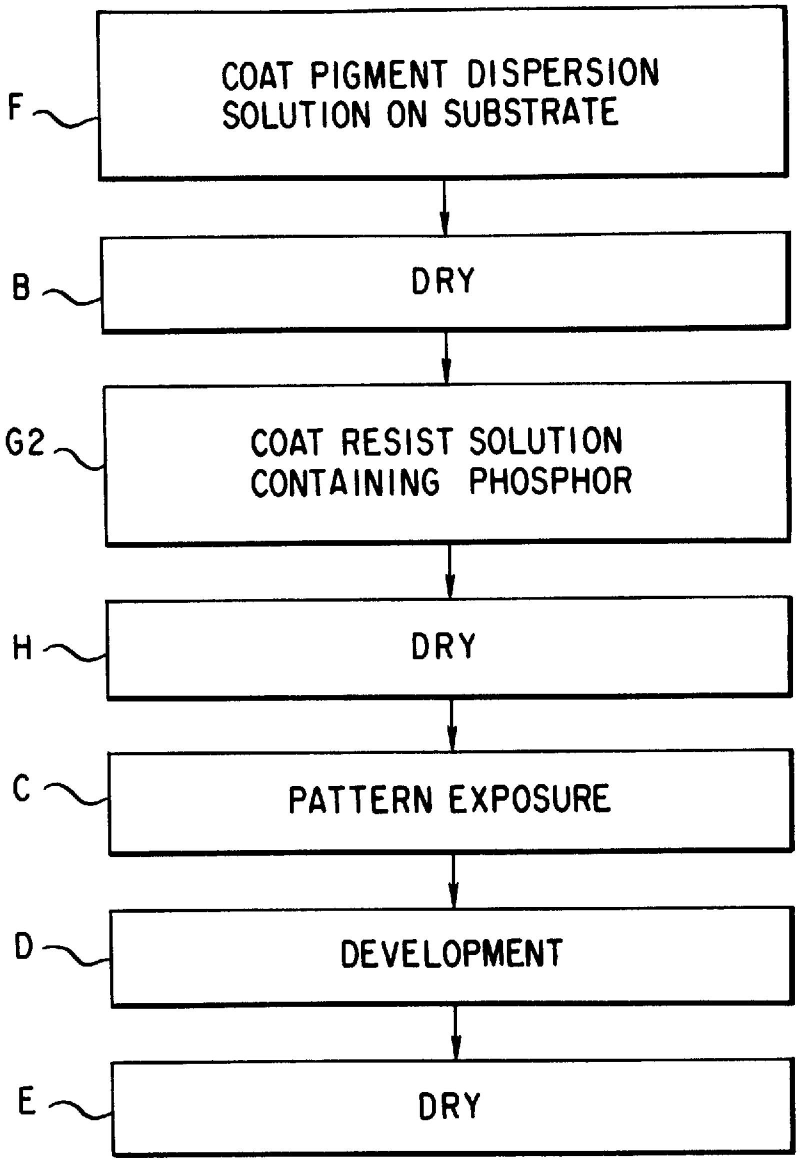
F I G. 5
F I G. 6A
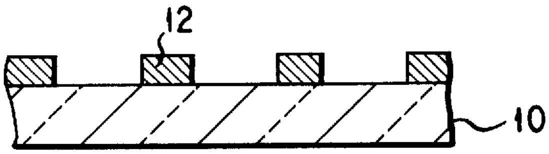
F I G. 6B
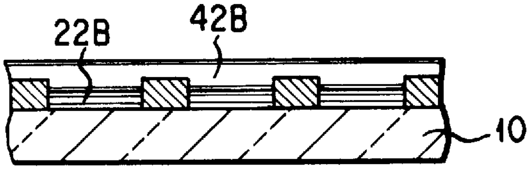

METHOD OF MANUFACTURING DISPLAY SCREEN

BACKGROUND OF THE INVENTION

1. Field of the Invention

The present invention relates to a method of manufacturing a display screen having a color filter, which is used in a cathode ray tube, a liquid crystal display element or the like.

2. Description of the Related Art

Conventionally, a filter pattern which is made by patterning a pigment layer into a predetermined pattern, is used in various fields. A color filter used in a liquid crystal display apparatus is a typical example of the filter pattern.

Further, as disclosed in, for example, U.S. Pat. No. 2,959,484 or 3,114,065, which is directed to a color cathode ray tube, a phosphor film with an optical filter which has a structure in which an optical filter of a color which corresponding to the color emitted by a phosphor film is provided in a front side of the phosphor film, that is, between the inner surface of the face plate of the panel and the phosphor film, is known. Usually, a plurality of phosphor films having emitting colors of red, blue and green are formed in a dot manner or a stripe manner on the inner surface of the face plate of a color cathode ray tube. As electron beams collide with these phosphor films, the phosphor films emit light, thus displaying an image. A filter-applied phosphor film is designed to achieve an improvement of image display characteristics such as contrast and color purity, and has a structure in which a filter pattern which transmits a light beam of the same color as the color emitted from the phosphor film itself, is provided between the face plate and the phosphor film. With this structure, of the external light made incident, the green and blue components can be absorbed by a red pigment film, the green and red components can be absorbed by a blue pigment film, and the blue and red components can be absorbed by a green pigment film. With use of filter-applied phosphor films, the contrast and the color purity of the display apparatus can be enhanced. For the formation of such a filter film, generally, a pigment film is applied on a substrate, and then an exposure and development are carried out on the film for patterning. During the patterning, a portion of the pigment film, which should remain as a desired pattern is required to have a sufficient adhesion property with respect to the substrate, whereas the other portion is required to have a sufficient removal property. Further, the pigment film is required to have a transparence, and it is required that pigment particles are dispersed uniformly without being gathered irregularly.

However, the bond between pigment particles and that between the pigment and the substrate are, in practice, relatively strong, and therefore some excessive portions of the pigment film are, in many cases, not removed in the development step, but remain on the substrate as residues. In order to avoid this, the following attempt was made. That is, the development was carried out before the pigment film was dried. However, this attempt entails another problem in which a good patterning cannot be carried out. That is, a sharp-edged pattern cannot be obtained. In other words, the boundary between the portion to remain and the portion to be removed after an exposure cannot be formed sharp.

In the case where such a filter is applied between a phosphor film and a substrate, first, a filter film is patterned as the exposure and development are repeated for each color by means of a slurry method. Then, on the filter film thus obtained, a phosphor which emit the same color as that of the filter film is patterned, as the exposure and development are repeated for each color by the slurry method. Thus, the above case involves a great number of production steps, making it complicated.

Under such circumstances, a method in which a phosphor film is applied on a pigment film, and patterning of these two layers is carried out by one exposure, is conventionally proposed (Jap. Pat. Appln. KOKAI Publication No. 52-77578 or No. 5-266795).

However, in the above-described method in which the patterning of the phosphor layer and the pigment layer is carried out by only one exposure, the phenomenon that the first film is dissolved while the second film is applied, easily occur. If the first layer is completely hardened in order to avoid the above drawback, the first film cannot be easily dissolved and removed by the development, which is carried out after the formation of the second layer. As a result, it is difficult to form the identical pattern in the pigment film and the phosphor film. Thus, in the case of the patterning by only one exposure, it is desirable that the two contradicting properties, namely, the dissolving property and the development property, be satisfied at the same time, and therefore this method involves a limited condition for work. As a result, phosphor layers with color filters, which have a uniform quality, cannot be obtained.

SUMMARY OF THE INVENTION

The present invention has been proposed in order to solve the above-described drawbacks of the conventional techniques, and the first object thereof is to form a filter layer having a good adhesion property with respect to a substrate screen, which can achieve a sharp edged and has a uniform composition, on a display screen, in a simple process.

The second object of the present invention is to provide a method of manufacturing a display screen, which is capable of forming a filter layer having a good adhesion property with respect to a substrate screen, which can achieve a sharp edged pattern and has a uniform composition, on a display screen, by one exposure and one development, even in the case where a layer having a different composition from that of a filter layer is formed on the filter layer.

According to the first aspect of the present invention, there is provided a method of manufacturing a display screen having a filter pattern, the method comprising the steps of: forming a two-layered film on a substrate, at least one of two layers containing a photoresist, and one of the two layers located on the substrate side, which is formed by applying a pigment dispersion solution containing at least pigment particles and solution of a salt of a polymer electrolyte, or polymer having charged anionic functionalities followed by drying; exposing the two-layered film via a certain mask pattern; and patterning the film by developing it by using a developing agent mainly made of water; wherein the upper layer of the two-layered film and/or the developing agent, contain a substance which forms a salt along with a polymer electrolyte.

According to the second aspect of the present invention, which can be used for patterning of a single layer, there is provided a method of manufacturing a display screen having a filter pattern, comprising the steps of: forming a pigment layer by applying a pigment dispersion solution containing pigment particles, a photoresist and solution of salt of a polymer electrolyte, on a substrate, followed by drying; and patterning the layer by exposing it and developing it using a development agent containing a substance which forms a salt with the polymer electrolyte.

The method of the present invention, in which a two-layered or single-layered film is patterned, can be divided into the following nine embodiments.

According to the first embodiment of the present invention, there is provided a method of manufacturing a display screen, comprising the steps of: applying a pigment dispersion solution containing pigment particles, a photoresist and a solution of a salt of a polymer electrolyte, on a substrate, followed by drying, thus forming a first layer; applying a solution containing a substance which forms the salt with the polymer electrolyte, on the first layer, followed by drying, thus forming a second layer, and patterning the first layer and the second layer by exposing them and developing them using a developing agent containing a substance which forms the salt with the polymer electrolyte.

According to the second embodiment of the present invention, there is provided a method of manufacturing a display screen, comprising the steps of: applying a pigment dispersion solution containing pigment particles, a photoresist and a solution of a salt of a polymer electrolyte, on a substrate, followed by drying, thus forming a first layer; applying a solution containing a substance which forms the salt with the polymer electrolyte, on the first layer, followed by drying, thus forming a second layer, and patterning the first layer and the second layer by exposing them and developing them using a developing agent.

According to the third embodiment of the present invention, there is provided a method of manufacturing a display screen, comprising the steps of: applying a pigment dispersion solution containing pigment particles, a photoresist and a solution of a salt of a polymer electrolyte, on a substrate, followed by drying, thus forming a pigment layer; and patterning the pigment layer by exposing it and developing it using a developing agent containing a substance which forms the salt with the polymer electrolyte.

According to the fourth embodiment of the present invention, there is provided a method of manufacturing a display screen, comprising the steps of: applying a pigment dispersion solution containing pigment particles and a solution of a salt of a polymer electrolyte, on a substrate, followed by drying, thus forming a first layer; applying a solution containing a photoresist and a substance which forms the salt with the polymer electrolyte, on the first layer, followed by drying, thus forming a second layer, and patterning the first layer and the second layer by exposing them and developing them using a developing agent containing a substance which forms the salt with the polymer electrolyte.

According to the fifth embodiment of the present invention, there is provided a method of manufacturing a display screen, comprising the steps of: applying a pigment dispersion solution containing pigment particles, and a solution of a salt of a polymer electrolyte, on a substrate, followed by drying, thus forming a first layer; applying a solution containing a photoresist and a substance which forms the salt with the polymer electrolyte, on the first layer, followed by drying, thus forming a second layer, and patterning the first layer and the second layer by exposing them and developing them using a developing agent.

According to the sixth embodiment of the present invention, there is provided a method of manufacturing a display screen, comprising the steps of: applying a pigment dispersion solution containing pigment particles and a solution of a salt of a polymer electrolyte, on a substrate, followed by drying, thus forming a first layer; applying a solution containing a photoresist on the first layer, followed by drying, thus forming a second layer, and patterning the first layer and the second layer by exposing them and developing them using a developing agent containing a substance which forms the salt with the polymer electrolyte.

According to the seventh embodiment of the present invention, there is provided a method of manufacturing a display screen, comprising the steps of: applying a pigment dispersion solution containing pigment particles, a photoresist and a solution of a salt of a polymer electrolyte, on a substrate, followed by drying, thus forming a first layer; applying a solution containing a photoresist and a substance which forms the salt with the polymer electrolyte, on the first layer, followed by drying, thus forming a second layer, and patterning the first layer and the second layer by exposing them and developing them using a developing agent containing a substance which forms the salt with the polymer electrolyte.

According to the eighth embodiment of the present invention, there is provided a method of manufacturing a display screen, comprising the steps of: applying a pigment dispersion solution containing pigment particles, a photoresist and a solution of a salt of a polymer electrolyte, on a substrate, followed by drying, thus forming a first layer; applying a solution containing a photoresist and a substance which forms the salt with the polymer electrolyte, on the first layer, followed by drying, thus forming a second layer, and patterning the first layer and the second layer by exposing them and developing them using a developing agent.

According to the ninth embodiment of the present invention, there is provided a method of manufacturing a display screen, comprising the steps of: applying a pigment dispersion solution containing pigment particles, a photoresist and a solution of a salt of a polymer electrolyte, on a substrate, followed by drying, thus forming a first layer; applying a solution containing a photoresist, followed by drying, thus forming a second layer, and patterning the first layer and the second layer by exposing them and developing them using a developing agent containing a substance which forms the salt with the polymer electrolyte.

According to the present invention, a solution of a salt of a polymer electrolyte is used for the first layer containing pigments, so as to make the first layer insoluble to a solvent in a simple way. Thus, the adhesion property of the layer with respect to the substrate screen can be improved. Further, by adding a substance which forms the salt with the polymer electrolyte, of the first layer, to at least the second layer or the developing agent, the first layer can be made soluble to the solvent, and therefore undesired portions of the first and second layers can be easily peeled and removed from the substrate in the development step, while achieving a sharp pigment layer.

Further, according to the present invention, a solution of a salt of a polymer electrolyte and a substance which forms the salt with the polymer electrolyte is used in combination, thereby making it possible to control the hardening, peeling and removal of the pigment layer. Consequently, the amount of the photoresist used in the patterning can be reduced. With an decrease in the photoresist amount, the maintenance of the solution used to form the display screen, can be facilitated, thus improving the productivity.

With use of the present invention method, excellent effects can be obtained even in the case where multiple layers comprising a pigment layer and an upper layer having different compositions from that of the pigment layer are formed, and these layers are patterned by only one exposure and one development. For example, an excellent adhesion between the substrate screen and the pigment layer can be achieved. Further, since the pigment layer is made sufficiently insoluble, it will not be dissolved out even if a layer having a different composition is formed thereon. Furthermore, the substances which can make the pigment layer soluble to a solvent are applied in the layers having different compositions and/or in a developing agent, and therefore the pigment layer and the layers having different compositions from that of the pigment layer can be easily peeled and removed from the substrate by a development. Thus, according to the present invention, a pigment layer having a good adhesion property with respect to the substrate screen, which has a sharp pattern and a uniform composition, can be easily formed by only one exposure and one development, and the condition for work can be sufficiently widened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a flow diagram describing a set of steps according to an example of the method of manufacturing a display screen according to the present invention;

FIGS. 6A to 6E are cross sections illustrating the steps described in FIG. 5.

DETAILED DESCRIPTION OF THE PREFERRED EMBODIMENTS

Figure 1:
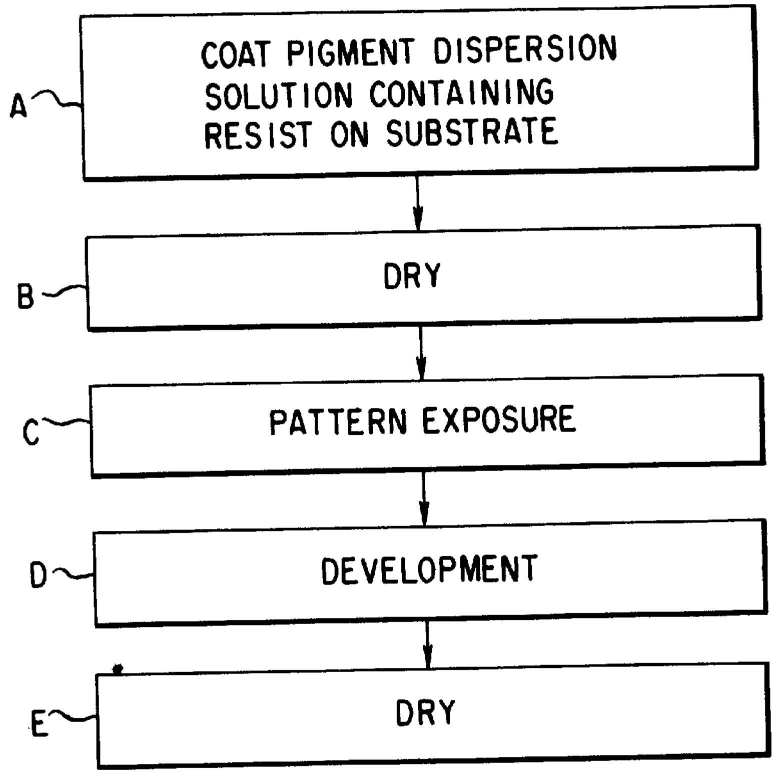
FIG. 1 is a flow diagram describing a set of steps according to an example of the method of manufacturing a display screen according to the present invention.

In the present invention method, a solution of a salt of a polymer electrolyte which is made insoluble to a solvent when it is dried, and a substance which forms the salt with the polymer electrolyte are used in combination. The solution of the salt of the polymer electrolyte is added as a dispersant into the dispersion solution containing pigments. In the solution of the salt of the polymer electrolyte, pigment particles are dispersed uniformly without being coagulated, and such a solution is applied on a substrate, followed by drying. As a result, the group which forms the salt of the polymer electrolyte is partially dissociated, making a polymer film insoluble to a solvent. Further, according to the present invention, a solution containing a substance which can form a salt along with a partially dissociated polymer electrolyte salt, is applied on the pigment layer and in a developing agent. Therefore, the polymer electrolyte contained in the pigment layer is made soluble, thus improving the peeling property in the development.

The present invention has been proposed under the above-described circumstances, and provides a method of forming a pigment layer, which is designed to uniformly disperse pigment particles and to achieve both the insoluble property which is requisite to the portion so as to remain as a pattern, and the peeling property which is requisite to the other portion which is not exposed during the development, at the same time.

The present invention can be divided into nine respects.

According to the first aspect of the present invention, there is provided a method of manufacturing a display screen, comprising the steps of: applying a pigment dispersion solution containing pigment particles, a photoresist and a solution of a salt of a polymer electrolyte having a group which vaporizes as the group is partially dissociated when dried, on a substrate, followed by drying, thus forming a first layer which is insoluble to a solvent; applying a solution containing a substance which forms the salt with the polymer electrolyte, on the first layer, followed by drying, thus forming a second layer, and patterning the first layer and the second layer by exposing them and developing them using a developing agent containing a substance which forms the salt with the polymer electrolyte.

In the first layer, the group which can form the salt of the polymer electrolyte, is partially dissociated, and the dissociated group is volatilized during drying process, thus forming a polymer film which is insoluble to the solvent. In the case where the second layer is applied on the first layer formed by the above-described manner, the substance of the second layer, which forms the salt with the polymer electrolyte, is diffused in the first layer without having pigments dissolved into the second layer, thus making it possible to form a water-soluble salt in the first layer.

A predetermined region of the first layer is fixed by an exposure of the photoresist. The first and second layers other than the fixed area can be removed by use of a developing agent, due to the presence of the salt soluble to the solvent. In this method, the substance which forms the salt with the polymer electrolyte is added to both the solution used to form the second layer and the developing agent, and therefore the removal of these layers can be further effectively carried out.

According to the second embodiment of the present invention, there is provided a method of manufacturing a display screen, comprising the steps of: applying a pigment dispersion solution containing pigment particles, a photoresist and a solution of a salt of a polymer electrolyte having a group which volatilizes as the group is partially dissociated when dried, on a substrate, followed by drying, thus forming a first layer which is insoluble to a solvent; applying a solution containing a substance which forms the salt with the polymer electrolyte, on the first layer, and forming a salt soluble to the solvent in the first layer, followed by drying, thus forming a second layer; and patterning the first layer and the second layer by exposing them and developing them using a developing agent.

In the method according to the second embodiment of the present invention, the substance which forms the salt with the polymer electrolyte is not added to the developing agent unlike in the first embodiment of the invention. However, since the substance which forms a salt with the polymer electrolyte in the second layer is diffused in the first layer, the first layer is made soluble to the solvent and therefore is dissolved into the solvent contained in the developing agent, making it possible to sufficiently remove the first layer. The method according to the second embodiment of the present invention is similar to that of the first aspect of the invention except that the substance which forms the salt with the polymer electrolyte is not added to the developing agent.

According to the third embodiment of the present invention, there is provided a method of manufacturing a display screen, comprising the steps of: applying a pigment dispersion solution containing pigment particles, a photoresist and a solution of a salt of a polymer electrolyte having a group which volatilizes as the group is partially dissociated when dried, on a substrate, followed by drying, thus forming a pigment layer which is insoluble to a solvent; and patterning the pigment layer by exposing it and developing it using a developing agent containing a substance which forms the salt with the polymer electrolyte.

The method according to the third embodiment of the present invention is similar to that of the first embodiment of the invention except that the second layer is not applied. Usually, in patterning by use of a photoresist and a developing agent, the pigment layer cannot be sufficiently hardened or made insoluble unless a very large amount of photoresist is added. However, with the method according to the third aspect of the invention, the solution of the salt of the polymer electrolyte is added to the first layer, and therefore the pigment layer can be sufficiently hardened and made insoluble even if the amount of photoresist is decreased. Further, in this method, the substance which forms the salt with the polymer electrolyte is added to the developing agent, and therefore the unnecessary portion can be effectively removed by patterning. As is well-known, a photoresist becomes very unstable when mixed with some other component, for example, pigment dispersion solution. The larger the amount of photoresist, the more difficult to control the dispersion solution containing the photoresist in a stable state, increasing the cost. However, with use of the present invention, the amount of photoresist can be decreased, and the photoresist-containing dispersion solution is made relatively stable. Therefore, the maintenance of the photoresist-containing dispersion solution, which takes much labor, can be reduced to a minimum level.

According to the fourth embodiment of the present invention, there is provided a method of manufacturing a display screen, comprising the steps of: applying a pigment dispersion solution containing pigment particles and a solution of a salt of a polymer electrolyte having a group which volatilizes as the group is partially dissociated when dried, on a substrate, followed by drying, thus forming a first layer which is insoluble to a solvent; applying a solution containing a photoresist and a substance which forms the salt with the polymer electrolyte, on the first layer, followed by drying, thus forming a second layer, and patterning the first layer and the second layer by exposing them and developing them using a developing agent containing a substance which forms the salt with the polymer electrolyte.

With regard to the fourth embodiment of the present invention, in the first layer, the group which can form the salt of the polymer electrolyte, is partially dissociated, and the dissociated group is volatilized during drying process, thus forming a polymer film which is insoluble to the solvent. In the case where the second layer is applied on the first layer formed by the above-described manner, the substance of the second layer, which forms the salt with the polymer electrolyte, is diffused in the first layer without having pigments dissolved into the second layer, thus making it possible to form a water-soluble salt in the first layer.

In this method, a photoresist is mixed in the second layer, and the second layer is fixed by exposure, so as to protect the first layer from the developing agent, thus patterning the layer. The portions of the first and second layers other than the area fixed by the exposure of the photoresist can be removed by use of a developing agent, due to the presence of the salt soluble to the solvent. Further, in this method, the substance which forms the salt with the polymer electrolyte is added to both the solution used to form the second layer and the developing agent, and therefore the removal of these layers can be further effectively carried out.

According to the fifth embodiment of the present invention, there is provided a method of manufacturing a display screen, comprising the steps of: applying a pigment dispersion solution containing pigment particles, and a solution of a salt of a polymer electrolyte having a group which volatilizes as the group is partially dissociated when dried, on a substrate, followed by drying, thus forming a first layer which is insoluble to a solvent; applying a solution containing a photoresist and a substance which forms the salt with the polymer electrolyte, on the first layer, followed by drying, thus forming a second layer, and patterning the first layer and the second layer by exposing them and developing them using a developing agent.

In the method according to the fifth embodiment of the present invention, a photoresist is added to the second layer, and the second layer is fixed by exposure, so as to protect the first layer from the developing agent, thus patterning the layer, in similar to the case of the fourth embodiment of the invention. Although the substance which forms the salt with the polymer electrolyte is not added to the developing agent as so in the fourth embodiment of the invention, the first layer which was made insoluble to the solvent by drying, forms a salt which is soluble to a solvent as the second layer is applied, and therefore the it can be removed sufficiently by the developing agent.

According to the sixth embodiment of the present invention, there is provided a method of manufacturing a display screen, comprising the steps of: applying a pigment dispersion solution containing pigment particles and a solution of a salt of a polymer electrolyte having a group which volatilizes as the group is partially dissociated when dried, on a substrate, followed by drying, thus forming a first layer which is insoluble to a solvent; applying a solution containing a photoresist on the first layer, followed by drying, thus forming a second layer, and patterning the first layer and the second layer by exposing them and developing them using a developing agent containing a substance which forms the salt with the polymer electrolyte.

In the method according to the sixth embodiment of the present invention, a photoresist is added to the second layer, and the second layer is fixed by exposure, so as to protect the first layer from the developing agent, thus patterning the layer, in similar to the case of the fourth embodiment of the invention. Although the substance which forms the salt with the polymer electrolyte is not contained in the second layer as so in the fourth aspect of the invention, the portions other than that fixed by first layer can be sufficiently removed in the development since the developing agent contains the substance which forms the salt with the polymer electrolyte.

According to the seventh embodiment of the present invention, there is provided a method of manufacturing a display screen, comprising the steps of: applying a pigment dispersion solution containing pigment particles, a photoresist and a solution of a salt of a polymer electrolyte having a group which volatilizes as the group is partially dissociated when dried, on a substrate, followed by drying, thus forming a first layer which is insoluble to a solvent; applying a solution containing a photoresist and a substance which forms the salt with the polymer electrolyte, on the first layer, followed by drying, thus forming a second layer, and patterning the first layer and the second layer by exposing them and developing them using a developing agent containing a substance which forms the salt with the polymer electrolyte.

With regard to the seventh embodiment of the present invention, both the first and second layers contain a photoresist. In the first layer, the group which can form the salt of the polymer electrolyte is partially dissociated, and the dissociated group is volatilized during drying process, thus forming a polymer film which is insoluble to the solvent. In the case where the second layer is applied on the first layer, the substance of the second layer, which forms the salt with the polymer electrolyte, can be diffused in the first layer without having pigments dissolved into the second layer since the first layer was made insoluble to the solvent, thus making it possible to form a water-soluble salt in the first layer.

Predetermined regions of the first and second layers are fixed by an exposure of the photoresist. The first and second layers other than the fixed area can be removed by use of a developing agent, due to the presence of the salt soluble to the solvent. In this method, the substance which forms the salt with the polymer electrolyte is added also to the developing agent, and therefore the removal of these layers can be further effectively carried out.

According to the eighth embodiment of the present invention, there is provided a method of manufacturing a display screen, comprising the steps of: applying a pigment dispersion solution containing pigment particles, a photoresist and a solution of a salt of a polymer electrolyte having a group which volatilizes as the group is partially dissociated when dried, on a substrate, followed by drying, thus forming a first layer which is insoluble to a solvent; applying a solution containing a photoresist and a substance which forms the salt with the polymer electrolyte, on the first layer, followed by drying, thus forming a second layer, and patterning the first layer and the second layer by exposing them and developing them using a developing agent.

In the method according to the eighth embodiment of the present invention, the substance which forms the salt with the polymer electrolyte is not added to the developing agent, unlike in the seventh embodiment of the invention. However, in this method, the first layer is made soluble to a solvent, and therefore it can be removed sufficiently in the development. This method is similar to the seventh embodiment of the invention except that the substance which forms the salt with the polymer electrolyte is not added to the developing agent.

According to the ninth embodiment of the present invention, there is provided a method of manufacturing a display screen, comprising the steps of: applying a pigment dispersion solution containing pigment particles, a photoresist and a solution of a salt of a polymer electrolyte having a group which volatilizes as the group is partially dissociated when dried, on a substrate, followed by drying, thus forming a first layer which is insoluble to a solvent; applying a solution containing a photoresist, followed by drying, thus forming a second layer, and patterning the first layer and the second layer by exposing them and developing them using a developing agent containing a substance which forms the salt with the polymer electrolyte.

In the method according to the ninth embodiment of the present invention, a photoresist is mixed into the second layer, and the second layer is fixed by exposure, so as to protect the first layer from the developer, thus patterning the layer, in similar to the case of the seventh embodiment of the invention. Although the substance which forms the salt with the polymer electrolyte is not contained in the second layer as so in the seventh embodiment of the invention, the portions other than that fixed by the exposure of the photoresist can be sufficiently removed in the development since the developing agent contains the substance which forms the salt with the polymer electrolyte.

The following is a description of the materials used in the present invention.

Examples of the polymer electrolyte used in the present invention are those types each having a dissociation group in the structure unit of the polymer. In the present invention, the polymer electrolyte is used also as a dispersant for dispersing pigment particles.

Preferable examples of the polymer electrolyte are anion polymer electrolytes.

More preferable examples of the polymer electrolyte are sodium salts, ammonium salts, amine salts and the like, of the following compounds: acrylic acid type or acrylic acid-styrene type copolymers, polymer polycarboxylic acids, styrene-polycarboxylic acid copolymers, aromatic formalin sulfonate condensation product, polyoxyethylenealkylether sulfate, polyoxyethylene alkylphenylether sulfate and the like. More specific examples of the acrylic acid type compound, are Dispex N-40 (tradename, of Allied Colloid Co.) (sodium salt) and Dispex A-40 (tradename, of Allied Colloid Co.) (ammonium salt); those of the acrylic acid copolymers are Dispex G-40 (tradename, of Allied Colloid Co.) (sodium salt) and Dispex GA-40 (tradename, of Allied Colloid Co.) (ammonium salt); those of the polymer polycarboxylic acids are Poiz 520 (tradename, of Kao) (sodium salt) and Discoate N-14 (Dai-ichi Kogyo Seiyaku) (ammonium salt); those of styrene-polycarboxylic acid copolymer are Oxylac SH-101 (Nihon Shokubai Kagaku) and the like; those of the ammonium salt of polyoxyethylene alkylethersulfate are Hitenor 08 (Dai-ichi Kogyo Seiyaku Co. Ltd.) and the like; those of the ammonium salt of polyoxyethylene alkylphenylethersulfate are Hitenor N-08 (Dai-ichi Kogyo Seiyaku Co. Ltd.) and the like. These materials can be used solely or in combination.

Of these materials, in order to form the first layer, an ammonium salt which can easily volatilize, is preferable, an ammonium salt of a polycarboxylic acid is more preferable, and an ammonium salt of an acrylic acid or an acrylic acid copolymer is further more preferable in order to achieve both good insoluble property and good peeling property.

The solution containing a salt of the polymer electrolyte should be made by using water as the main solvent.

The pigments which can be used in the present invention are of either type of inorganic or organic. Especially, the pigments which can be dispersed in the filter layer of the filter-applied phosphor film, so that the filter layer can achieve a sufficient transparency without having the scattering of light, should preferably used. The particle diameters of the pigments, which can maintain a good transparency, should be, preferably, 1 μm or less, and more preferably, 0.1 μm.

Further, in the case where the invention is applied to a color cathode ray tube which undergoes a high temperature step in the production process, inorganic pigments are preferable since they each have a high heat photoresistance.

The following are specific examples of the pigments.

Examples of the red pigment are Sicotrans Red L-2817 (particle diameter: 0.01 μm to 0.02 μm, BASF Inc.) which is of the iron (II) oxide group, Cromophthal Red A2B (particle diameter: 0.01 μm, CIBA GAIGY Inc.) which is of the anthraquinone type. Examples of the blue pigment are Cobalt Blue X (particle diameter: 0.01 μm to 0.02 μm, TOYO-GANRYO Inc.) which is of the cobalt aluminate ($Al_2O_3$-CoO), Ultramarine Blue No. 8000 (particle diameter: 0.3 μm, DAI-ICHI KASEI Inc.) which is of the ultramarine blue group, Lionol Blue FG-7370 (particle diameter: 0.01 μm, TOYO INK) which is of the phthalocianine blue group. Examples of the green pigment are Dypyroxide TM-Green #3320 (particle diameter: 0.01 μm to 0.02 μm, DAINICHI SEIKA Inc.) of the $TiO_2$-NiO-CoO-ZnO group, Dypyroxide TM-Green #3340 (particle diameter: 0.01 μm to 0.02 μm, DAINICHI SEIKA Inc.) of the CoO-$Al_2O_3$-$Cr_2O_3$-$TiO_2$ group, Dypyroxide TM-Green #3420 (particle diameter: 0.01 μm to 0.02 μm, DAINICHI SEIKA Inc.) of the CoO-$Al_2O_3$-$Cr_2O_3$ group, ND-801 (particle diameter: 0.35 μm, NIHON DENKO Inc.) of the $Cr_2O_3$ group, Fastogen Green S (particle diameter: 0.01 μm, DAINIPPON INK) of the chlorinated phthalocyanine green group, Fastogen Green 2YK (particle diameter: 0.01 μm, DAINIPPON INK) of the brominated phthalocyanine green group.

The concentration of the pigment dispersed in the dispersion agent made of the polymer electrolyte should be in a range of 0.1 weight % to 50 weight %, preferably, 1 weight % to 50 weight %. If the pigment concentration is less than 0.1 weight %, the color of the pigment layer cannot be observed, whereas if it exceeds 1 weight %, the color can be clearly observed. Or if it exceeds 50 weight %, the viscosity of the dispersion solution is drastically increased, making it impossible to apply a uniform film.

The ratio of the concentration of the polymer electrolyte (weight %) with respect to the pigment concentration (weight %) should be in a range of 0.005 to 1, preferably, 0.01 to 0.5. If the ratio is less than 0.005, the dispersion force of the pigment particles becomes weak, and the irregular concentration of pigment particles easily occurs, whereas if the ratio exceeds 1, the coloring power becomes weak, and the devitrification occurs when baked.

The above-described polymer electrolyte and pigment are mixed into pure water, followed by stirring, and thus a dispersion solution used to form a pigment layer can be obtained. As long as 10 weight % or less, a water-soluble organic solvent such as alcohol can be added to the pure water.

Examples of the photoresist of the present invention are water-soluble photoresists such as ammonium bichrominate (ADC)/polyvinyl alcohol (PVA), sodium bichrominate (SDC)/PVA, diazonium salt or the like/PVA, stilbazole, ADC/casein.

In the case where a photoresist is contained in a pigment dispersion solution, the ratio of the photoresist concentration to the polymer electrolyte concentration should be in a range of 0.005 to 100, more preferably, 0.03 to 30. If the ratio is 0.005 or less, the patterning property is deteriorated, decreasing the sensitivity in particular, whereas if the ratio is larger than 100, the devitrification occurs, deteriorating the filter characteristics.

Next, the developing agent used in the development step will now be described.

The developing agent should be of the type made by using water as a main solvent, and it is preferable that lukewarm water, more preferably, at a temperature of 35° C., should be used.

In order to achieve a good patterning property, an alkali solution having a pH value of 8.5 or higher, should preferably be used, and more preferably, an alkali solution having a pH value of 9.5 or higher, should be used.

Further, an alkali solution which contains a substance capable of making the polymer electrolyte soluble, the polymer electrolyte having been made insoluble to a solvent such as water, as the substance can form a salt along with a partially dissociated polymer electrolyte salt, can be added to the developing agent. Examples of such a substance are salts of alkali metals, hydroxides of metals, and ammonium salts such as LiCl, $LiNO_3$, NaCl, $Na_2CO_3$, $Na_2S_2O_3$, NaOH, sodium dichromate (SDC), ammonium dichromate (ADC). These substances can be used solely or in combination. Further, these substances can be mixed in the solution used for making the second layer, or in both of the developing agent and the solution used for making the second layer. The solution containing a substance which can form a salt along with a partially dissociated polymer electrolyte salt, should be of the type made by using water as a main solvent.

With regard to the present invention, in the case where an ammonium salt of the acrylic acid or the acrylic acid copolymer is used as a dispersant in the first layer, a preferable substance for achieving a good peeling property and a good insoluble property of the pigment layer applied and dried, is an alkali metal salt, and a compound containing Li or Na ion which has a small ion diameter is more preferable, with sodium bichrominate, especially, being most preferable.

The manufacturing method of the present invention proceeds in the following manner.

The following description will be made in connection with a filter-applied phosphor screen used for a color cathode ray tube as an example of the display screen.

First, a pigment dispersion solution containing as the pigment particles and the polymer electrolyte pigment dispersion solution as main contents, is applied on a substrate. An application method can be selected appropriately in accordance with the shape, size and the like of the substrate, and examples of such a method are a spin coat method, a roller method and an immersing method. The spin coat method is particularly preferable in order to obtain a predetermined uniform thickness. The application layer of the pigment dispersion solution is then dried. The drying method can be arbitrarily selected without any particular limitation as long as it can volatilize the moisture and partially dissociate a salt of a polymer electrolyte. For example, drying using a heater, drying with a heat wave, or a long term drying at room temperature or the like can be used in accordance with necessity.

For the patterning which is carried out with only the pigment layer, it only-suffices if the pigment dispersion solution contains a photoresist. With application of a pigment layer containing the photoresist, the portion which is exposed by a high-pressure mercury lamp or the like, is hardened. After that, when a development is carried out with use of an alkali aqueous solution containing a substance capable of making the polymer electrolyte soluble, the polymer electrolyte having been made insoluble to a solvent such as water, as the substance can form a salt along with a partially dissociated polymer electrolyte salt, a predetermined filter pattern can be obtained.

In the case where the photoresist is not contained in the pigment dispersion solution, but a photoresist layer is formed after application and drying of the pigment layer, and then the exposure and development are carried out, the time period required to the exposure can be shortened. Consequently, the sensitivity property can be improved. The filter layer formed in the above-described manner has good tightness with regard to a substrate, and the range of the thickness of the filter layer thus formed can be increased. The solution containing the photoresist should be of the type made by using water as a main solvent.

In the case where a plurality of, usually, three color filter layers, namely, red, green and blue are formed, the above step should be repeated for each color.

In the case where a color cathode ray tube having a filter-applied phosphor surface, which is made by coating a phosphor film on the filter layer, the filter layer is applied and dried, and then it can be exposed to a predetermined pattern with use of a shadow mask. After forming three color filter layers with shadow masks, a phosphor layer can be formed by a conventionally known method.

In the exposure/development method for a photoresist layer which is laminated after the pigment layer is applied and dried, phosphor particles are added in the photoresist solution or the solution containing a substance which forms a salt with the polymer electrolyte. In this way, the pigment layer and the phosphor film can be patterned at the same time. The following is a brief description thereof.

In the case where a filter-applied phosphor film is formed on the panel of a color cathode ray tube, such a procedure is as follows.

First, a pigment dispersion solution is applied on the inner surface of a face plate, and dried. The application is carried out while fixing the inner surface of the face plate in a predetermined direction such as the upper, lateral or downward direction. The direction of the face plate can be selected so as to achieve a uniform application layer, in consideration of solid component, viscosity and irregular application of the pigment dispersion solution.

Examples of the application method are the spin coat, the roller method and the immersing method. In order to achieve a predetermined uniform film thickness, the spin coat method is particularly preferable.

The drying method can be arbitrarily selected without any particular limitation as long as it can volatilize the moisture and partially dissociate salt of a polymer electrolyte. For example, drying using a heater, drying with a heat wave, or a long term drying at room temperature or the like can be used for forming the first layer. It is also possible that a patterned light absorption layer is formed in advance on the inner surface of the face plate prior to the formation of the first layer.

Next, a dispersion solution containing phosphorous substances is prepared, and this solution is applied by use of the same method as for the first layer, on the first layer, thus forming the second layer.

Lastly, the layers are exposed by use of, for example, a high-pressure mercury lamp, via a shadow mask, thus they are patterned into a desired pattern. After that, a developing agent is sprayed thereon for the development. This operation is carried out for each color.

In the case where a layer having phosphorous substances is formed as the second layer, the average particle diameter of the pigment should preferably be determined in consideration of the slurry containing the phosphorous substances, for the second layer.

For example, the experimental results obtained by the inventors of the present invention indicate the following. That is, in the case where the phosphorous substances having an average particle diameter of about 5 to 10 $\mu$m are used, the average particle diameter of the pigment must be 1 $\mu$m or less. Otherwise, phosphorous substances enter gaps between pigment particles, making it difficult to form the two-layer structure. Or the average particle diameter of the pigment should preferably be 1 $\mu$m or less, more preferably, 0.1 $\mu$m or less, in order to maintain the transparency of the first layer.

The concentration of the pigment dispersed in the dispersion agent mainly made of the polymer electrolyte should be in a range of 0.1 weight % to 50 weight %, preferably, 1 weight % to 50 weight %. If the pigment concentration is less than 0.1 weight %, the color of the pigment layer cannot be observed, whereas if it exceeds 1 weight %, the color can be clearly observed. Or if it exceeds 50 weight %, the viscosity of the dispersion solution is drastically increased, making it impossible to apply a uniform film.

In the present invention, the relationship between the concentration of the polymer electrolyte and the pigment concentration is very important. The ratio of the concentration, by weight %, of the polymer electrolyte with respect to the pigment concentration, which may be also expressed as polymer electrolyte concentration/pigment concentration, should be in a range of 0.005 to 1, preferably, 0.01 to 0.5. If the ratio exceeds 1, the first layer is made soluble before the completion of the drying of a solution, which is for example, a phosphor dispersion solution, used for the second layer, and therefore the first layer and second layer are mixed with each other, making it impossible to form the two-layer structure. Or, if the ratio is less than 0.005, the bonding force acting between pigment particles becomes strong, thereby deteriorating the peeling property.

The above-described polymer electrolyte and pigment are mixed into pure water, followed by stirring, and thus a dispersion solution used to form a pigment layer can be obtained. As long as 5 weight % or less, a water-soluble organic solvent such as alcohol can be added to the pure water.

In order to improve the peeling property, a nonion-based dispersant can be used along with the polymer electrolyte. Examples of the nonion-based dispersant are polyoxyethylene derivatives such as polyoxyethylenelaurylether, polyoxyethylenenonylphenylether, and polyoxyethylenesorbitanmonolaurate, and polyoxyalkylene derivatives such as polyoxyalkylenealkylether. Specific examples thereof are Noigen EA-140, Noigen EA-170 (both by DAI-ICHI KOGYO SEIYAKU), Emulgen 106, Emulgen A-500, Reodol TW-L120 (all by Kao). The mixture ratio of the nonion/anion $NH_4$ salt, preferable for improving the peeling property is 1/30 to 1/300.

Next, a phosphor dispersion solution which can be applied for the application of the second layer will be described.

The phosphorous substances contained in the phosphor dispersion solution may be red, blue and green phosphorous substances conventionally used in a cathode ray tube or a color image receiving apparatus.

Examples of the red phosphor substance are $Y_2O_2S$:Eu, $Y_2O_3$:Eu, (Zn, Cd)S:Ag, $Zn_3(PO_4)_2$:Mn; examples of the blue phosphor substance are ZnS:Ag, Cl, ZnS:Ag, Al, ZnS:Ag; and examples of the green phosphor substance are ZnS:Cu, Al, ZnS:Au, Al, ZnS:Cu, Au, Al, $Zn_2SiO_4$:Mn, As.

Additives used in the second layer are used in the phosphor slurry and/or the developing agent. A substance capable of making the polymer electrolyte soluble, the polymer electrolyte having been made insoluble to a solvent such as water, as the substance can form a salt along with a partially dissociated polymer electrolyte salt, can be used as an additive. Further, a photoresist is added to the phosphor slurry.

According to the present invention, a salt of a polymer electrolyte is used as a dispersant for making a pigment layer on a substrate, by application and drying. Thus, the salt of the polymer electrolyte is partially dissociated, making the pigment layer insoluble to a solvent such as water. For example, in the case of an ammonium polyacrylate salt, polyacrylic acid is made, thereby making the layer insoluble to water.

On the other hand, in the case where substances such as Li ions or Na ions, which can form a salt along with a polymer electrolyte, are added to the solution for the second layer applied on the first layer, and/or the developing agent, these ions are diffused into the first layer, which is the pigment layer, and salts of polymer electrolytes are replaced by these ions, making the layer soluble to the solvent contained in the developing agent. For example, in the case of the above polyacrylic acid, it is formed eventually into sodium polyacrylate, making it soluble to water.

Therefore, the peeling property in the patterning by development can be improved. The portion to remain as a pattern is not peeled by the development but remain on the substrate since the photoresist formed within or on the pigment layer has been hardened by exposure. For example, in the case where a pigment layer and a photoresist layer are formed, the pigment layer which was made soluble is patterned together with the photoresist layer. More specifically, in the case of a negative photoresist, an unexposed portion is developed together with the photoresist layer, and an exposed portion is covered by the photoresist layer and remains on the substrate as it is. With this method, a two-layer film pattern which cannot be dissolved or has an excellent development property, can be obtained at a low cost.

EXAMPLES

Examples of the present invention will now be described with reference to accompanying figures.

TABLES 1 and 2 provided below each list embodiments of the present invention, and the composition of the application solution used in each of the first and second layers. Example of the upper section of each table corresponds to the nine embodiments of the present invention. In each table, mark ○ indicates that the material listed in the extreme left section is contained, whereas mark x indicates that the material is not contained. The compositions 1B, 1G, 1R and the like of the first layer in each column were as listed in TABLE 3, the compositions 1U, 2U and the like of the second layer were as listed in TABLE 4, and the compositions 1D, 2D and the like, of the developing solutions, were as listed in TABLE 5. Further, the term "salt forming material" used in the TABLES means a substance which forms a salt along with a polymer electrolyte.

TABLE 1

| Examples | | 1 | 2 | 3 | 4-1 | 4-2 | 5-1 | 5-2 |
|---|---|---|---|---|---|---|---|---|
| Composition of solution First layer | | | | | | | | |
| Pigment | | o | o | o | o | o | o | o |
| Salt of polymer electrolyte | | o | o | o | o | o | o | o |
| Photoresist | | o | o | o | x | x | x | x |
| Second layer | | | | | | | | |
| Photoresist | | x | x | — | o | o | o | o |
| Salt forming substance | | o | o | — | o | o | o | o |
| Phosphor substance | | x | x | — | x | x | x | x |
| Developing agent | | | | | | | | |
| Salt forming substance | | o | x | o | o | o | x | x |
| Solution | | | | | | | | |
| First layer | B | 1B | 1B | 1B | 2B | 2B | 2B | 2B |
| | G | 1G | 1G | 1G | 2G | 2G | 2G | 2G |
| | R | 1R | 1R | 1R | 2R | 2R | 2R | 2R |
| Second layer | B | 1U | 1U | — | 3U | 4U | 3U | 4U |
| | G | 1U | 1U | — | 3U | 4U | 3U | 4U |
| | R | 1U | 1U | — | 3U | 4U | 3U | 4U |
| Developing solution | B | 1D | water | 1D | 1D | 1D | water | water |
| | G | 2D | water | 2D | 2D | 2D | water | water |
| | R | 3D | water | 3D | 3D | 3D | water | water |

TABLE 2

| Examples | | 6-1 | 6-2 | 7-1 | 7-2 | 8-1 | 8-2 | 9 |
|---|---|---|---|---|---|---|---|---|
| Composition of solution First layer | | | | | | | | |
| Pigment | | o | o | o | o | o | o | o |
| Salt of polymer electrolyte | | o | o | o | o | o | o | o |
| Photoresist | | x | x | o | o | o | o | o |
| Second layer | | | | | | | | |
| Photoresist | | o | o | o | o | o | o | o |
| Salt forming substance | | x | x | o | o | o | o | x |
| Phosphor substance | | x | o | x | x | x | x | x |
| Developing agent | | | | | | | | |
| Salt forming substance | | o | o | o | o | x | x | o |
| Solution | | | | | | | | |
| First layer | B | 2B | 2B | 1B | 1B | 1B | 1B | 1B |
| | G | 2G | 2G | 1G | 1G | 1G | 1G | 1G |
| | R | 2R | 2R | 1R | 1R | 1R | 1R | 1R |
| Second layer | B | 2U | 5B | 3U | 4U | 3U | 4U | 2U |
| | G | 2U | 5G | 3U | 4U | 3U | 4U | 2U |
| | R | 2U | 5R | 3U | 4U | 3U | 4U | 2U |
| Developing solution | B | 1D | 1D | 1D | 1D | water | water | 1D |
| | G | 2D | 2D | 2D | 2D | water | water | 2D |
| | R | 3D | 3D | 3D | 3D | water | water | 3D |

TABLE 3

Composition of pigment dispersion solution which is used for first layer

| Pigment dispersion solution | | Composition | |
|---|---|---|---|
| Blue pigment dispersion solution | 1B | Blue pigment: Cobalt blue X (cobalt aluminate, TOYO GANRYO Inc.) | 30 g |
| | | Salt of polymer electrolyte: Dispex GA-40 (Ammonium salt of polyacrylic acid copolymer.Allid Colloid Inc.) | 0.7 g |
| | | Photoresist: ADC 0.03 g + PVA 0.47 g | 0.5 g |
| | | Water: | 68.8 g |
| Blue pigment dispersion solution | 2B | Blue pigment: Cobalt blue X (cobalt aluminate, TOYO GANRYO Inc.) | 30 g |
| | | Salt of polymer electrolyte: Dispex GA-40 (Ammonium salt of polyacrylic acid copolymer.Allid Colloid Inc.) | 0.7 g |
| | | Water: | 69.3 g |
| Green pigment dispersion solution | 1G | Green pigment: Dypyroxide TM-Green #3320 ($TiO_2$—NiO—CoO—ZnO, DAINICHI SEIKA Inc.) | 30 g |
| | | Salt of polymer electrolyte: Dispex Ga-40 (Ammonium salt of polyacrylic acid copolymer.Allid Colloid Inc.) | 0.44 g |
| | | Dispex N-40 (Sodium salt of polyacrylic acid copolymer.Allid Colloid Inc.) | 0.26 g |
| | | Photoresist: ADC 0.12 g + PVA 1.88 g | 2.0 g |
| | | Water: | 67.3 g |
| Green pigment dispersion solution | 2G | Green pigment: Dypyroxide TM-Green #3320 ($TiO_2$—NiO—CoO—ZnO, DAINICHI SEIKA Inc.) | 30 g |
| | | Salt of polymer electrolyte: Dispex Ga-40 (Ammonium salt of polyacrylic acid copolymer.Allid Colloid Inc.) | 0.44 g |
| | | Dispex N-40 (Sodium salt of polyacrylic acid copolymer.Allid Colloid Inc.) | 0.26 g |
| | | Water: | 69.3 g |
| Red pigment dispersion solution | 1R | Red pigment: Sicotrans Red L-2817 ($Fe_2O_3$, BASF Inc.) | 30 g |
| | | Salt of polymer electrolyte: Hitenor08 (Ammonium salt of polyoxyethylene-alkylethersulfate, DAIICHI KOGYO SEIYAKU Co. Ltd.) | 0.7 g |
| | | Photoresist: ADC 0.12 g + PVA 1.88 g | 2.0 g |
| | | Water: | 67.3 g |
| Red pigment | 2R | Red pigment: Sicotrans Red L-2817 ($Fe_2O_3$, BASF Inc.) | 30 g |
| | | Salt of polymer electrolyte: Hitenor08 | 0.7 g |

TABLE 3-continued

Composition of pigment dispersion solution which is used for first layer

| Pigment dispersion solution | Composition | |
|---|---|---|
| dispersion solution | (Ammonium salt of polyoxyethylene-alkylethersulfate, DAIICHI KOGYO SEIYAKU Co. Ltd.) | |
| | Water: | 69.3 g |

TABLE 4

Composition of solution used for forming 2nd layer

| Solution for forming 2ad layer | Composition | |
|---|---|---|
| 1U | Salt forming substance: Sodium dichromate | 0.1 g |
| | Water: | 49.9 g |
| 2U | Photoresist: ADC 0.2 g + PVA 3.0 g | 3.2 g |
| | Surfactant: | 0.1 g |
| | Water: | 96.7 g |
| 3U | Photoresist, Salt forming substance: | |
| | SDC 0.2 g + PVA 3.0 g | 3.2 g |
| | Surfactant: | 0.1 g |
| | Water: | 96.7 g |
| 4U | Photoresist: ADC 0.2 g + PVA 3.0 g | 3.2 g |
| | Salt forming substance: $Na_2CO_3$ | 0.2 g |
| | Surfactant: | 0.1 g |
| | Water: | 96.7 g |
| 5B | Blue phosphor: ZnS:Ag, Cl | 100 g |
| | Photoresist: ADC 0.3 g + PVA 5.0 g | 5.3 g |
| | Surfactant: | 0.01 g |
| | Water: | 140 g |
| 5G | Green phosphor: ZnS:Cu, Al | 100 g |
| | Photoresist: ADC 0.4 g + PVA 8.0 g | 8.4 g |
| | Surfactant: | 0.01 g |
| | Water: | 160 g |
| 5R | Red phosphor: $Y_2O_2S$:Eu | 100 g |
| | Photoresist: ADC 0.5 g + PVA 10.0 g | 10.5 g |
| | Surfactant: | 0.01 g |
| | Water: | 190 g |

TABLE 5

Composition of developing agent

| Developing agent | Composition |
|---|---|
| 1D | Aqueous solution of 0.2 weight % of $Na_2CO_3$ |
| 2D | Aqueous solution of 0.2 weight % of NaOH |
| 3D | Aqueous solution of 0.2 weight % of NaOH and 0.1 weight % of LiCl |

The following are descriptions of specific manufacturing methods, which are made on the basis of some of the examples.

Example 3

An example of the method of manufacturing a display screen, according to the third embodiment of the present invention will now be described. In this example, the description will be made in connection with the case where a filter pattern is formed by exposing and developing the pigment layer itself, and a patterned phosphor film is formed thereon, thus manufacturing a filter-applied phosphor surface used in a color cathode ray tube.

FIG. 1 is a flow diagram illustrating steps in an example of the method of manufacturing a display screen, according to the third embodiment of the present invention. FIGS. 2A to 2F are explanatory diagrams each showing a step in the above method. Basically, a filter pattern for one color can be formed by a set of the steps shown in FIGS. 1A to 1E. In order to form a plurality of filter patterns, a set of the steps 1A to 1E should be repeated for each color.

Figure 2A:
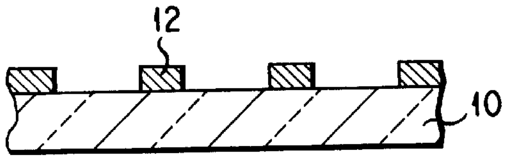
FIGS. 2A to 2F are cross sections illustrating the steps described in FIG. 1.

First, as shown in FIG. 2A, on an inner surface of a panel 10 of a color cathode ray tube, that is, a substrate made of, for example, glass, a light absorption layer 12 having a predetermined pattern and serving as a black matrix, is formed. The light absorption layer can be formed by a conventionally known method. More specifically, a photoresist is applied on the substrate, and the photoresist is exposed via a shadow mask, followed by development and drying. Thus, a stripe-shaped or dot-shaped light hardening film is made to remain in a section in which a pigment layer and a phosphor layer are supposed to be formed. A light absorption material, for example, graphite, is applied and adhered on the light hardening film, and then cleaned with hydrogen peroxide solution so as to dissolve the light hardening film. Further, the undesired portion of the light absorption layer is removed together with the light absorption material, and a hole section in which the pigment layer and the phosphor layer are to be formed, is exposed, thus forming a patterned light absorption layer 12.

Next, in order to form blue, green and red filters, pigment dispersion solutions 1B, 1G and 1R having the following compositions were prepared.

A blue pigment dispersion solution 1B, as shown in TABLE 3, was prepared by dispersing 30 weight % of cobalt aluminate (Cobalt Blue X (particle diameter: 0.01 μm to 0.02 μm, TOYO GANRYO Inc.) as blue pigment particle, 0.5 weight % of ammonium dichromate (ADC)+polyvilylalcohol (PVA), as a photoresist, and 0.7 weight % of ammonium salt of polyacrylic acid copolymer (Dispex GA-40, Allied Colloid Inc.) as polymer electrolyte, into pure water. The ratio of the polymer electrolyte concentration/the pigment concentration was set to 0.023, the ratio of the photoresist concentration/the polymer electrolyte concentration was set to 0.714, and the ratio of the photoresist concentration/the pigment concentration was set to 0.017.

A green pigment dispersion solution 1G was prepared by dispersing 30 weight % of $TiO_2$-NiO-CoO-ZnO (Dypyroxide TM-Green #3320 (particle diameter: 0.01 μm to 0.02 μm, DAINICHI SEIKA Inc.)) as green pigment particle, 2 weight % of ADC+PVA, as a photoresist, and 0.44 weight % of ammonium salt of polyacrylic acid (Dispex GA-40, Allied Colloid Inc.) and 0.26 weight % of sodium salt of polyacrylic acid (Dispex N-40, Allied Colloid Inc.) as polymer electrolyte into pure water. The ratio of the polymer electrolyte concentration/the pigment concentration was set to 0.023, the ratio of the photoresist concentration/the polymer electrolyte concentration was set to 2.857, and the ratio of the photoresist concentration/the pigment concentration was set to 0.067.

A red pigment dispersion solution 1R was prepared by dispersing 30 weight % of fine particles of $Fe_2O_3$ as red pigment particle, 2 weight % of ADC+PVA, as a photoresist, and 0.7 weight % of ammonium salt of polyoxyethylene-alkylethersulfate (Hitenor 08 of Daiichi Kogyo Seiyaku Co. Ltd.) as polymer electrolyte, into pure water. The ratio of the polymer electrolyte concentration/the pigment concentration was set to 0.023, the ratio of the photoresist concentration/the polymer electrolyte concentration was set to 2.857, and the ratio of the photoresist concentration/the pigment concentration was set to 0.067.

The application step A and the drying step B were carried out in the following manners.

Figure 2B:
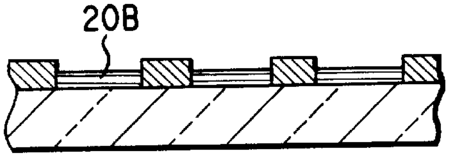

While maintaining the temperature of the panel 10 of the color cathode ray tube, serving as a substrate, at 30° C., the above-described blue pigment dispersion solution 1B was applied. Then, the panel 10 was rotated at 100 to 150 rpm so as to shake off the excessive portion of the pigment dispersion solution, thus forming an application layer having a constant thickness. After that, the application layer was dried by a heater at a temperature of 120° C. for 3 to 4 minutes, thus obtaining a blue pigment application layer as can be seen in FIG. 2B.

The pattern exposure step C was carried out in the following manner.

Figure 2C:
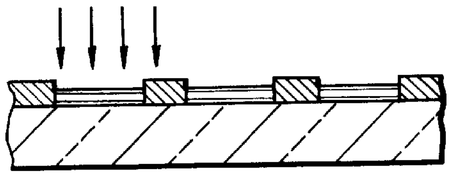

As shown in FIG. 2C, the layer was exposed into a predetermined pattern via a shadow mask (not shown) by use of a high-pressure mercury lamp.

The developing step D and the drying step E were carried out in the following manners.

Figure 2D:
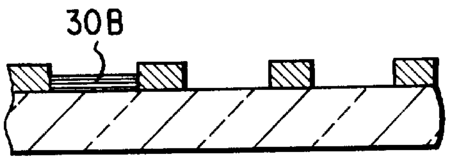

A developing agent 1D, that is, an alkali solution, for example, having a pH value of 9 and containing $Na_2CO_3$, is sprayed at a developing agent pressure of 2 to 10 $kg/cm^2$ in a mist fashion, thus performing a development, and a blue pigment layer 30B having a predetermined pattern was formed as shown in FIG. 2D.

Next, as in a similar manner to that of the above process for forming a blue pigment layer, a green pigment layer and a red pigment layer were formed. With regard to the developing agent, the developing agent 2D shown in TABLE 5 was used for the green pigment layer, and the developing agent 3D was used for the red.

Figure 2E:
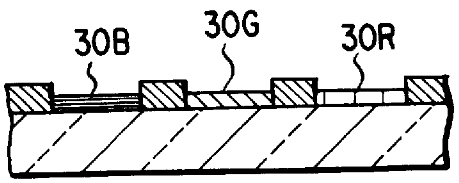

As shown in FIG. 2E, a filter pattern consisting of the blue pigment layer 30B, the green pigment layer 30G and the red pigment layer 30R was formed on the inner surface of the panel 10.

Figure 2F:
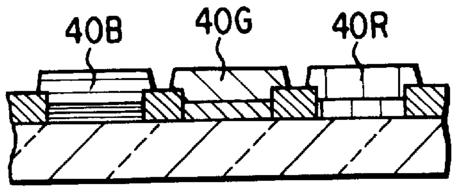

Next, by means of a regular method, as shown in FIG. 2F, the blue phosphor layer 40B, a green phosphor layer 40G and a red phosphor layer 40R were formed to correspond respectively to the blue pigment layer 30B, the green pigment layer 3OG and the red pigment layer 30R.

It should be noted that phosphor suspension solutions having the following compositions were used. A blue phosphor suspension solution was prepared by mixing 100 g of blue phosphorous substances (ZnS:Ag, Cl), 5 g of polyvinylalcohol, 0.30 g of ammonium dichromate, 0.01 g of surface active agent and 140 g of pure water, all together with stirring. A green phosphor suspension solution was prepared by mixing 100 g of green phosphorous substances (ZnS:Cu, Al), 8 g of polyvinylalcohol, 0.40 g of ammonium dichromate, 0.01 g of surface active agent and 160 g of pure water, all together with stirring. A red phosphor suspension solution was prepared by mixing 100 g of red phosphorous substances ($Y_2O_2S$:Eu), 10 g of polyvinylalcohol, 0.50 g of ammonium dichromate, 0.01 g of surface active agent and 190 g of pure water, all together with stirring.

In the above-described method, a desired filter-tipped phosphor film, having the pigment layer and the phosphor layer on the substrate 10, was obtained. A color cathode ray tube which was made by use of the desired phosphor film exhibited an excellent contrast and a good colorimetric purity. Further, a filter pattern was formed at a predetermined position, for example, a position in which a blue phosphor layer should be formed, and a blue filter was formed at that position. Thus, the pigment particles of a blue filter did not remain as a residue in the position for a different color. Consequently, a mixture of color was not observed in the filter, achieving a high calorimetric purity.

The following is a specific example of the method in which a two-layer film is formed, followed by exposure and development, which is made on the basis of Example 4.

Example 4-2

An example of the method of manufacturing a display screen, according to the fourth embodiment of the present invention will now be described.

Figure 3:
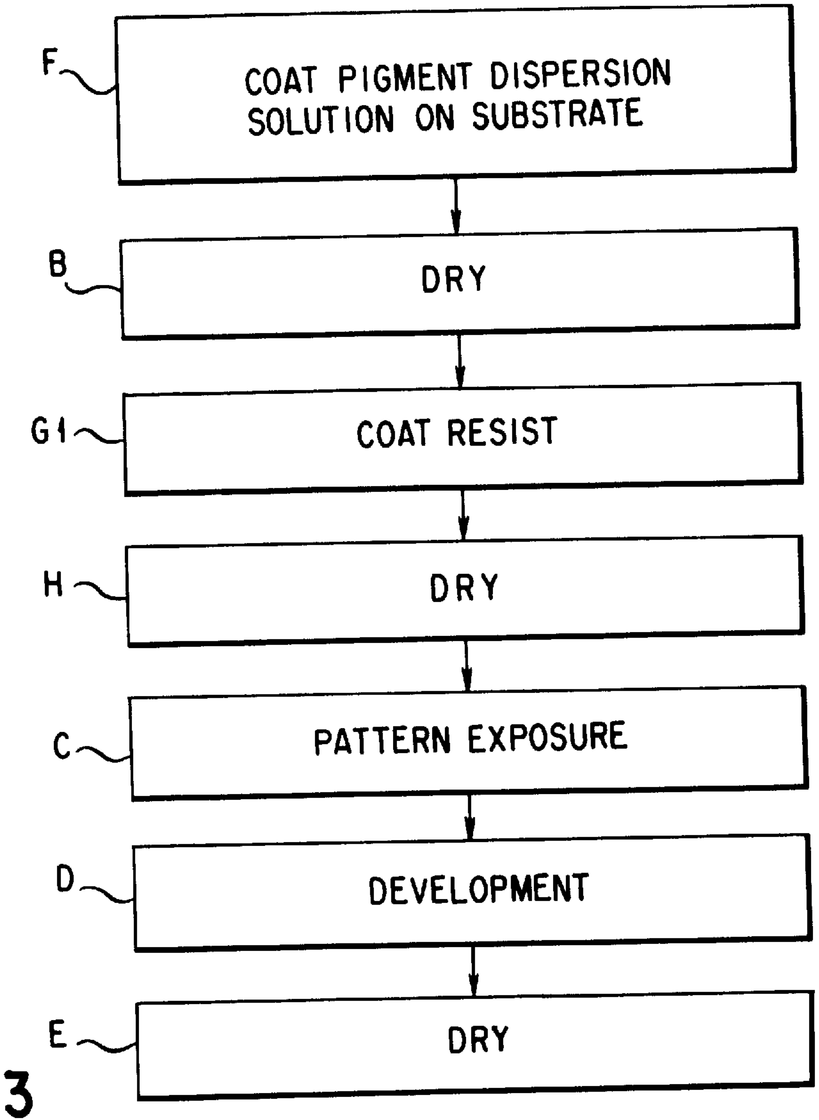
FIG. 3 is a flow diagram describing a set of steps according to an example of the method of manufacturing a display screen according to the present invention.

FIG. 3 is a flow diagram illustrating steps of the example, in which a two-layer film is formed, and then it is patterned by exposure and development. In order to form a plurality of filter patterns, a set of the steps shown in FIG. 3 should be repeated for each color.

First, as in the case of Example 3, a panel in which a black matrix was formed, was prepared.

A pigment dispersion solution application step F and a drying step B were carried out in the following manners.

In order to form blue, green and red filters, pigment dispersion solutions 2B, 2G and 2R having the compositions listed in TABLE 3 were prepared. These solutions were different from the pigment dispersion solutions used in the above Example 3, in respect that these solutions did not contain photoresists.

A blue pigment dispersion solution 2B was prepared by dispersing 30 weight % of cobalt aluminate (Cobalt Blue X (particle diameter: 0.01 μm to 0.02 μm, TOYO GANRYO Inc.) as blue pigment particle, and 0.7 weight % of ammonium salt of polyacrylic acid copolymer (Dispex GA-40, Allied Colloid Inc.) as polymer electrolyte, into pure water. The ratio of the polymer electrolyte concentration/the pigment concentration was set to 0.023.

A green pigment dispersion solution 2G was prepared by dispersing 30 weight % of $TiO_2$-NiO-CoO-ZnO (Dypyroxide TM-Green #3320 (particle diameter: 0.01 μm to 0.02 μm, DAINICHI SEIKA Inc.)) as green pigment particle, and 0.44 weight % of ammonium salt of polyacrylic acid (Dispex GA-40, Allied Colloid Inc.) and 0.26 weight % of sodium salt of polyacrylic acid (Dispex N-40, Allied Colloid Inc.) as polymer electrolyte, into pure water. The ratio of the polymer electrolyte concentration/the pigment concentration was set to 0.023.

A red pigment dispersion solution 2R was prepared by dispersing 20 weight % of fine particles of $Fe_2O_3$ as red pigment particle, and 0.7 weight % of ammonium salt of polyoxyethylenealkylethersulfate (Hitenor 08 of Daiichi Kogyo Seiyaku Co. Ltd.) as polymer electrolyte, into pure water. The ratio of the polymer electrolyte concentration/the pigment concentration was set to 0.035.

FIGS. 4A to 4F are cross sections illustrating the steps of FIG. 3.

Figure 4A:
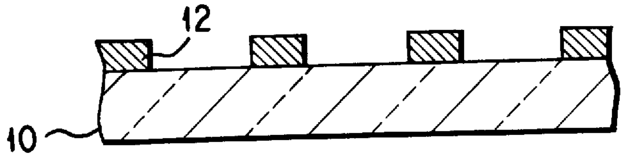
FIGS. 4A to 4F are cross sections illustrating the steps described in FIG. 3.

First, as shown in FIG. 4A, on an inner surface of a panel 10 of a color cathode ray tube, that is, a substrate made of, for example, glass, a light absorption layer 12 having a predetermined pattern and serving as a black matrix, is formed in a similar manner to that of the Example 3.

As in the Example 3, while maintaining the temperature of the panel 10 at 30° C., the above-described blue pigment dispersion solution 2B was applied. Then, the panel 10 was rotated at 100 to 150 rpm so as to shake off the excessive portion of the pigment dispersion solution. After that, the application layer was dried by a heater at a temperature of 120° C. for 3 to 4 minutes, thus obtaining a blue pigment application layer.

The photoresist solution application step G1 and the drying step H were carried out in the following manner.

Figure 4B:
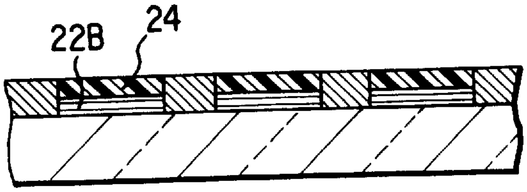

That is, a photoresist solution 2U having a composition of 3 weight % of polyvinylalcohol, 0.20 weight % of ammonium dichromate, 0.01 weight % of surface activating agent, and a balance of pure water, as shown in TABLE 4, was prepared. The solution was applied and dried in a similar manner to the formation of the pigment layer, and a photoresist layer 24 was laminated on a blue pigment layer 22B as shown in FIG. 4B.

The pattern exposure step C was carried out in the following manner.

Figure 4C:
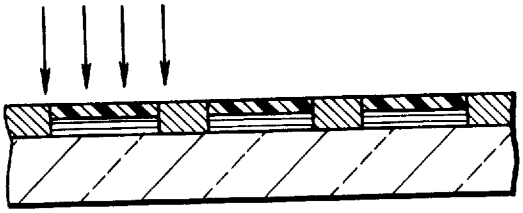

As shown in FIG. 4C, the layer was exposed into a predetermined pattern via a shadow mask (not shown) by use of a high-pressure mercury lamp. In this example, the exposure time was shortened to only ⅕ of that of the Example 3, in which a pigment and a photoresist were mixed together.

The developing step D was carried out in the following manners.

Figure 4D:
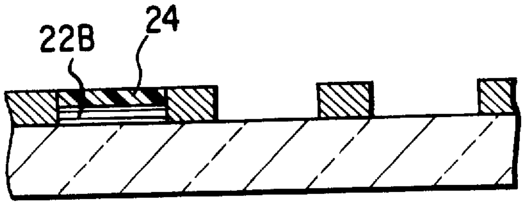

A developing agent 1D, that is, an alkali solution, for example, having a pH value of 9 and containing $Na_2CO_3$ which serves as a material which forms a salt with a polymer electrolyte, is sprayed at a developing agent pressure of 2 to 10 $kg/cm^2$ in a mist fashion, thus performing a development, and a pattern in which a blue pigment layer 22B and a photoresist layer 24 were laminated, was formed as can be seen in FIG. 4D.

Next, as in a similar manner to that of the above process for forming a blue pigment layer, a green pigment layer and a red pigment layer were formed. The developing agent 2D shown in TABLE 5 was used for the green pigment layer, whereas the developing agent 3D was used for the red pigment layer.

Figure 4E:
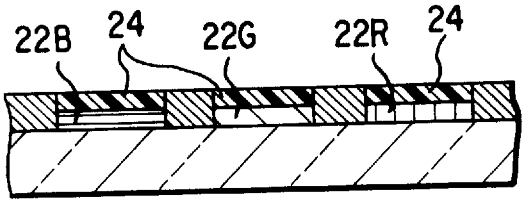

As shown in FIG. 4E, a filter pattern consisting of the blue pigment layer 22B, the green pigment layer 22G and the red pigment layer 22R was formed on the inner surface of the panel 10.

Figure 4F:
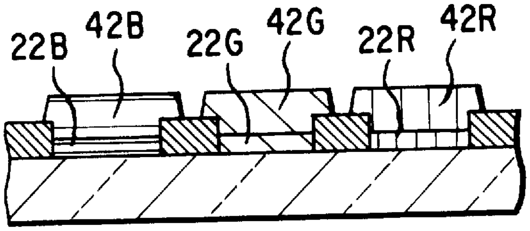

Next, the photoresist layers 24 on each of the blue, green and red pigment layers was removed, and then phosphor layers 42B, 42G and 42R were formed by means of a regular method, as shown in FIG. 4F. It should be noted that the phosphor suspension solutions used in this example were similar to those used in the Example 3.

In this method, a desired filter-applied phosphor film having the pigment layer and the phosphor layer on the inner surface of the panel 1, was obtained. A color cathode ray tube which was made by use of the phosphor film exhibited an excellent contrast and a good calorimetric purity. Further, a filter pattern was formed at a predetermined position, for example, a position in which a blue phosphor layer should be formed, and a blue filter was formed at that position. Thus, the pigment particles of a blue filter did not remain as a residue in the position for a different color. Consequently, a mixture of color was not observed in the filter, achieving a high calorimetric purity.

In the case of the Example 3, if the sensitivity with regard to the exposure should be improved, the ratio of the amount of the photoresist with respect to that of the pigment should be increased, which may cause a deterioration of the transparency. In this example, a photoresist layer is separately provided, and therefore the exposure sensitivity can be greatly improved without adversely affecting the transparency of the pigment layer. The portion of the pigment layer, which was made insoluble as it was dried, to remain, was not made soluble by the developing agent, and therefore the patterning property was not affected.

Example 6-2

An example of the method of manufacturing a display screen, according to the sixth embodiment of the present invention will now be described.

In the above-described Example 4, photoresist layers are formed on pigment layers, and after patterning the pigment layers for the colors, phosphor layers of the respective colors are formed. However, if the phosphorous substances are added in advance in the photoresist layers, the pigment layers and the phosphor layers can be patterned at the same time. FIG. 5 is a flow diagram illustrating steps in an example of the method of manufacturing a display screen, according to the sixth embodiment of the present invention. FIGS. 6A to 6E are cross sections each showing a step in the example shown in FIG. 5. In this example, a filter pattern for one color can be formed by a set of the steps F, B, G2, H, C, D and E shown in FIG. 5. In order to form a phosphorous surface of a color display, it only suffices if a set of the steps illustrated in FIG. 5 are repeated for each color. Therefore, the number of steps for exposure and development can be reduced to a half of the case of the Example 4.

The pigment layer application step F and the drying step B were carried out in the following manner.

First, pigment dispersion solutions 2B, 2G and 2R similar to those used in the Example 4 and phosphor suspension solutions 5B, 5G and 5R listed in TABLE 4 were prepared.

Next, in a manner similar to the method used in FIG. 6A, a blue pigment dispersion layer 2B was formed on an inner surface of a panel 10 on which light absorption layers 12 were formed as shown in FIG. 6A.

The phosphor-containing photoresist application step G2 and the drying step H were carried out in the following manner.

That is, the blue phosphor suspension solution 5B was applied on the substrate on which the blue pigment layer was formed, followed by drying, and then a phosphor-containing photoresist layer 42B was laminated on the pigment layer 22B as shown in FIG. 6B.

The pattern exposure step H was carried out in the following manner.

Figure 6C:
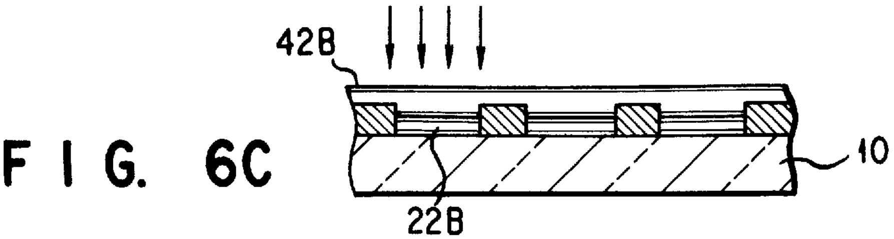

As shown in FIG. 6C, the layers were exposed into a predetermined pattern via a shadow mask, by use of a high-pressure mercury lamp.

The development step D was carried out in the following manner.

Figure 6D:
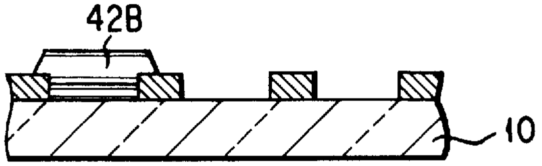
Figure 6E:
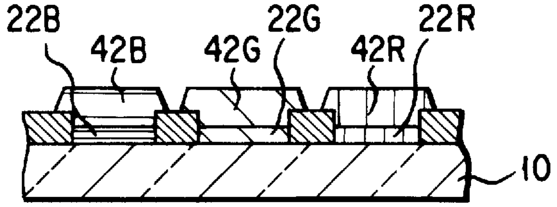

A developing agent 1D, that is, an alkali solution, for example, having a pH value of 9 and containing NaOH serving as a material which forms a salt with a polymer electrolyte, is sprayed at a developing agent pressure of 2 to $10\ kg/cm^2$ in a mist fashion, thus performing a development, and a laminate pattern consisting of a blue pigment layer 22B and a blue phosphor layer 42B was formed as shown in FIG. 6D.

Next, as in a similar manner to that of the above process for forming a blue pigment layer, a green pigment layer/phosphor layer and a red pigment layer/phosphor layer were formed.

The developing agent 2D was used for the green pigment layer, whereas the developing agent 3D was used for the red pigment layer.

With the above-described constitution, the number of the exposure steps can be reduced as compared to those of the Examples 3 and 4, and therefore this example is advantageous in terms of facilities.

The above-described example was described in connection with the case where a filter-applied phosphor surface used for a color cathode ray tube is manufactured; however the present invention is not limited to the above example, but can be applied to the cases where a filter layer patterned into a predetermined pattern, is manufactured.

In this example, the substance which can form a salt along with a partially dissociated polymer electrolyte salt, is added to the developing agent, in order to improve the patterning characteristics. In the case where a photoresist-containing layer is laminated on a pigment layer as in the Example 4, the substance which can form a salt with a polymer electrolyte, may be added to the photoresist-containing film. However, if the substance is added to the photoresist-containing film and the film is laminated on the pigment layer, the pigment layer, which is the underlayer, may be made soluble to the solvent before the photoresist layer is hardened by irradiation of light by exposure. Therefore, it is preferable that the substance which can form a salt with a polymer electrolyte should be added to the developing agent.

In the above example, the developing agents 1D, 2D and 3D were respectively used for the blue, green and red pigment layers; however the combination of the developing agents is not limited to this.

Further, in the examples so far explained, the pigment layer are formed in the order of blue, green and red; however, naturally, the order is not limited to this. The present invention may be used to form not only pigment layers, but also phosphor layers. Furthermore, whether or not the solution used for forming the second layer contains a phosphor substance, in the embodiments where pattering is carried out after the two-layer film is formed, is also arbitrary.

In the above descriptions, only typical examples are specifically discussed. The examples shown in TABLES 1 to 3 exhibited excellent patterning properties. Thus, with the method of manufacturing a display screen, of the present invention, good patterning characteristics, which indicate how sharp is the edge of the boundary between a portion to remain as a pattern after exposure and an unexposed portion to be removed, can be achieved. Thus, the residue of the pigment can be cleanly removed. Consequently, an accurate predetermined pattern of a pigment layer can be obtained in simple steps as compared to those of the present invention.

Figure 7:
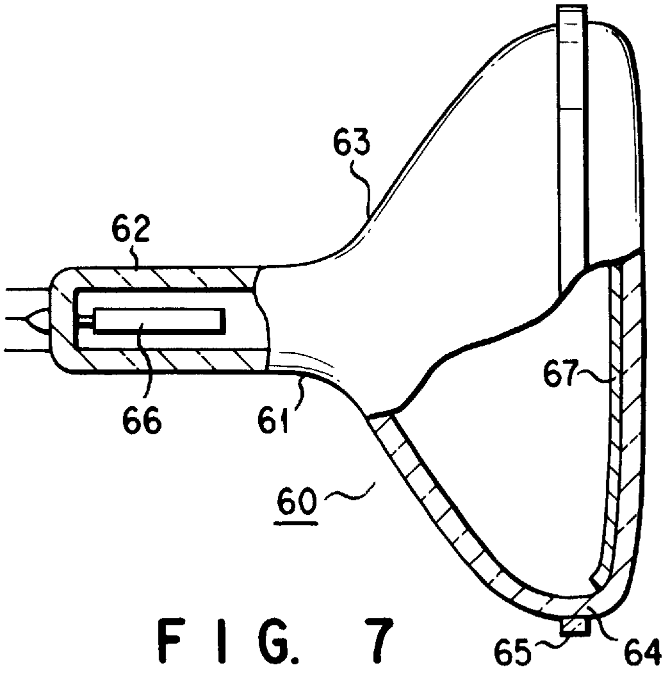
FIG. 7 is a diagram showing an example of the color cathode ray tube.

The display screen in which a phosphor layer is formed on a pigment layer as described above, can be used as a display screen of a color image receiving tube. FIG. 7 is a diagram illustrating an example of a color image receiving tube to which a display screen of the present invention can be applied.

FIG. 7 is a partially cutaway side view showing a cathode ray tube manufactured on the basis of the present invention. A cathode ray tube 60 has an airtight glass envelope 61 the interior of which is evacuated. The envelope 61 has a neck 62 and a cone 63 continuously extending from the neck 62. In addition, the envelope 61 has a faceplate 64 sealed by a first glass. An explosion-proof tension band 65 consisting of a metal is wound around the periphery of the side wall of the faceplate 64. An electron gun 66 for emitting electron beams is arranged in the neck 62. A phosphor screen 67 is formed on the inner surface of the faceplate 64. The phosphor screen 67 is constituted by a pigment layer as an optical filter and a phosphor layer formed thereon, which is excited by electron beams from the electron gun 66 to emit light. A deflection unit (not shown) is arranged outside the cone 63. The deflection unit serves to deflect electron beams to scan over the phosphor screen.

Evaluation of Dissolving Properties, Adhesion Properties and Peeling Properties:

Next, the method of the present invention, in which exposure and development are carried out after forming a two-layer film, was examined in terms of dissolving out property, adhesion property and peeling property of the pigment layer, taking, particularly, the fourth embodiment of the present invention as an example. The evaluation methods and results were as described below.

Example 10

Of the filter-applied phosphor layers, the blue phosphor layer was formed on the inner surface of the face plate of a color cathode ray tube.

The blue pigment dispersion solution was prepared by dispersing 30 weight % of cobalt aluminate (Cobalt Blue X (particle diameter: 0.01 $\mu$m to 0.02 $\mu$m, TOYO GANRYO Inc.), and 0.3 weight % of ammonium salt of polyacrylic acid copolymer (Dispex GA-40, Allied Colloid Inc.), into pure water. The ratio of the polymer electrolyte concentration/the pigment concentration was set to 0.01.

A phosphor suspension solution (phosphor slurry) was prepared by mixing 40 g of blue phosphor substance (ZnS:Ag, Cl), 0.16 g of sodium dichromate (SDC), 1.4 g of polyvinyl alcohol (average molecular weight: 2400, 88% of saponification and the like) and 54 g of pure water, all of which were weighed).

While maintaining the temperature of the panel 10 of the color cathode ray tube at 30° C., the pigment dispersion solution was applied on the inner surface of the faceplate. Then, the panel 10 was rotated at 100 to 150 rpm so as to shake off the excessive portion of the pigment dispersion solution. After that, the application layer was dried by a heater at a temperature of 120° C. for 3 to 4 minutes, thus obtaining a blue pigment application layer.

The phosphor slurry was applied on the inner surface of the faceplate, on which the blue pigment layer was formed in the same manner as above. Then, the panel 10 was rotated at 100 to 150 rpm so as to shake off the excessive portion of the pigment dispersion solution. After that, the application layer was dried by a heater at a temperature of 120° C. for 3 to 4 minutes, thus obtaining a blue phosphor application layer on the blue pigment layer.

The layers were exposed into a predetermined pattern via a shadow mask by use of a high-pressure mercury lamp. A developing agent was sprayed at a developing agent pressure of 2 to $10\ kg/cm^2$ in a mist fashion, thus performing a development, and a blue phosphor layer with a blue filter, having a predetermined pattern was formed. The developing agent used here was pure water having a temperature of 40° C.

The filter-applied phosphor layer thus obtained was evaluated in terms of the following properties.

The dissolving-out property: the dissolving-out means that a component of the first layer is dissolved by the solution for the second layer, and the component is mixed into the first layer. The evaluation as to the dissolving out property was made on the basis of how much the absorption of the absorption peak of the reflection of the first pigment layer, is deteriorated as compared to the case where the dissolving-out does not occur. In the case where the absorption was not at all deteriorated, it was judged as "○", in the case where 80% or more of the absorption still remained as compared to that of the case where no dissolving out occurred, it was judged as "Δ", and in the case where the absorption was less than 80%, it was judged as "x".

The adhesion property: the adhesion property indicates the state in which the two-layered film remains at an exposed portion after development. In the case where 100% of the area of the exposed portion remained, it was judged as "○", in the case where 80% or more and less than 100% of the area still remained, it was judged as "Δ", and in the case where the area was less than 80%, it was judged as "x".

The peeling property: the peeling property indicates how much of the unexposed portion was removed. In the case where 100% of the area of the unexposed portion was removed, it was judged as "○", in the case where 80% or more and less than 100% of the portion was removed, it was judged as "Δ", and in the case where the area was less than 80%, it was judged as "x". The results of the evaluation were summarized in TABLE 7.

Examples 11 to 16

In each of these examples, a blue phosphor layer with a blue filter was prepared with the same materials and method used in Example 10 except that the mixture ratio in the pigment dispersion solution was changed. The mixture ratios of the pigment dispersion solutions used are specified in TABLE 6.

Each of the filter-applied phosphor layers thus obtained was evaluated by the same method as of Example 10. The results of the evaluation are summarized in TABLE 7.

Comparative Examples 1 and 2

In each of these examples, a blue phosphor layer with a blue filter was prepared with the same materials and method used in Example 10 except that the mixture ratio between the polymer electrolyte and the pigment in the pigment dispersion solution was set to 0.0033 (in Comparative Example 1) and 1.5 (Comparative Example 2). The mixture ratios of the pigment dispersion solutions used are specified in TABLE 6.

Each of the filter-applied phosphor layers thus obtained was evaluated by the same method as of Example 10. The results of the evaluation are summarized in TABLE 7.

Comparative Examples 3 and 4

The blue pigment dispersion solution was prepared by dispersing 30 weight % of cobalt aluminate (Cobalt Blue X (particle diameter: 0.01 μm to 0.02 μm, TOYO GANRYO Inc.), and 1.5 weight % (Comparative Example 3) and 15 weight % of (Comparative Example 4) of ammonium salt of polyacrylic acid copolymer (Dispex GA-40, Allied Colloid Inc.), into pure water. A blue-filter-applied blue phosphor layer was obtained using the same phosphor slurry and the method as those of Example 10. The mixture ratio of the pigment dispersion solution was described in TABLE 6.

Each of the filter-applied phosphor layers thus obtained was evaluated by the same method as of Example 10. The results of the evaluation are summarized in TABLE 7.

Comparative Examples 5 to 13

In each of these examples, a blue phosphor layer with a blue filter was prepared with the same materials and method used in the respective one of the Examples 10 to 16, and the Comparative Examples 1 and 2 except that ammonium dichromate (ADC) was used in place of sodium dichromate (SDC).

Each of the filter-applied phosphor layers thus obtained was evaluated by the same method as of Example 10. The results of the evaluation are summarized in TABLE 8.

TABLE 6

| | | Blue pigment | Dispersant 1 | Dispersant 2 | Pure water | Ratio |
|---|---|---|---|---|---|---|
| Examples | 10 | 30.0 | 0.3 | — | 69.7 | 0.01 |
| | 11 | 30.0 | 0.15 | — | 69.85 | 0.005 |
| | 12 | 30.0 | 1.5 | — | 68.5 | 0.05 |
| | 13 | 30.0 | 10.0 | — | 60.0 | 0.33 |
| | 14 | 30.0 | 15.0 | — | 55.0 | 0.50 |
| | 15 | 20.0 | 16.0 | — | 64.0 | 0.80 |
| | 16 | 20.0 | 20.0 | — | 60.0 | 1.00 |
| Comparative Examples | 1 | 30.0 | 0.1 | — | 69.9 | 0.0033 |
| | 2 | 20.0 | 30.0 | — | 50.0 | 1.50 |
| | 3 | 30.0 | — | 1.5 | 68.5 | 0.05 |
| | 4 | 30.0 | — | 15.0 | 55.0 | 0.50 |

(in weight %)

Blue pigment: cobalt aluminate
Dispersant 1: ammonium salt of polyacrylic acid copolymer
Dispersant 2: sodium salt of polyacrylic acid copolymer
Ratio: Ratio between dispersant/blue pigment

TABLE 7

| | | Dissolving-out property | Adhesion property | Peeling property |
|---|---|---|---|---|
| Examples | 10 | ○ | ○ | ○ |
| | 11 | ○ | ○ | Δ |
| | 12 | ○ | ○ | ○ |
| | 13 | ○ | ○ | ○ |
| | 14 | ○ | ○ | ○ |
| | 15 | Δ | ○ | ○ |
| | 16 | Δ | Δ | ○ |
| Comparative Examples | 1 | ○ | ○ | × |
| | 2 | × | Δ | ○ |
| | 3 | × | Δ | — |
| | 4 | × | × | — |

TABLE 8

| | | Composition of pigment dispersion solution | Dissolving property | adhesion property | Peeling property |
|---|---|---|---|---|---|
| Comparative Examples | 5 | Same as Example 10 | ○ | ○ | × |
| | 6 | Same as Example 11 | ○ | ○ | × |
| | 7 | Same as Example 12 | ○ | ○ | × |
| | 8 | Same as Example 13 | ○ | ○ | × |
| | 9 | Same as Example 14 | ○ | ○ | × |
| | 10 | Same as | ○ | ○ | × |

TABLE 8-continued

| | Composition of pigment dispersion solution | Dis-solving property | adhe-sion property | Peeling prop-erty |
|---|---|---|---|---|
| | Example 15 | | | |
| 11 | Same as Example 16 | ○ | ○ | × |
| 12 | Same as Comparative Example 1 | ○ | ○ | × |
| 13 | Same as Comparative Example 2 | Δ | ○ | × |

As can be seen in TABLE 7, in the case where a sodium salt of a polyacrylic acid copolymer is added to the pigment dispersion solution (Comparative Examples 3 and 4), the dissolving-out property is deteriorated. In the case where the pigment layer is formed by the application/drying method, it is not preferable that a non-volatile or non-combustible salt be solely used.

Comparative Example 1, where the ratio of the dispersant/pigment is 0.0033, exhibits a poor peeling property, and therefore there is a tendency that an excellent patterning is difficult to perform. This is considered because, due to an insufficient amount of polymer electrolyte, the pigment particles are made not easily soluble since the bonding force between pigment particles becomes strong even though the polymer electrolyte is made soluble by alkali metal ions contained in the phosphor slurry.

Comparative Example 2, where the ratio of dispersant/pigment is 1.50, has a tendency that the dissolving out property is deteriorated. This is because, due to an excessive amount of polymer electrolyte, the pigment layer is made soluble prior to the completion of the drying of the phosphor slurry.

As can be seen in TABLES 6 and 7, two-layer film patterns having an excellent dissolving out property, can be stably obtained in a wide range of the ratio of dispersant/pigment, from 0.005 to 1.00.

Example 17

In this example, a blue-filter-applied blue phosphor layer was prepared with the same materials and method as those of Example 10 except that ultramarine blue was used in place of cobalt aluminate in the pigment dispersion solution.

The filter-applied phosphor layer thus obtained was evaluated by the same method as of Example 10, and substantially the same results as those of Example 10 were obtained. Further, blue-filter-applied blue phosphor layers were prepared with various amounts of dispersant as in Examples 11 to 16, and they were evaluated. The results of the evaluation were the same as those summarized in TABLE 7.

Example 18

In this example, a blue phosphor layer with a blue filter was prepared with the same materials and method as those of Example 10 except that ZnS:Ag, Al was used as the blue phosphor substance.

The filter-applied phosphor layer thus obtained was evaluated by the same method as of Example 10, and substantially the same results as those of Example 10 were obtained. Further, blue-filter-applied blue phosphor layers were prepared with various amounts of dispersant as in Examples 11 to 16, and they were evaluated. The results of the evaluation were the same as those summarized in TABLE 7.

Examples 19 to 60

In each of the examples, a blue-filter-applied blue phosphor layer was obtained by the same method used in Example 10 except that a pigment dispersion solution shown in TABLE 9 and a phosphor slurry shown in TABLE 10 were prepared, and they were combined as listed in TABLES 11 and 12. In Examples 19 to 37, the temperature of the developing agent was set to 25° C. and the pH value thereof was set to 7.0, and in Examples 38 to 60, the temperature and pH value thereof were set to 40° C. and 9.0, respectively. The filter-applied phosphor films thus obtained were evaluated by the same method as of Example 10. The results of the evaluation were summarized in TABLES 11 and 12. TABLE 11 shows the results obtained in the case where the temperature and the pH value of the developing agent were set to 25° C. and 7.0, respectively, whereas TABLE 12 shows the results obtained in the case where the temperature and the pH value of the developing agent were set to 40° C. and 9.0, respectively.

Comparative Examples 14 to 31

In each of the examples, a blue-filter-applied blue phosphor layer was obtained by the same method used in Example 10 except that a pigment dispersion solution shown in TABLE 9 and a phosphor slurry shown in TABLE 10 were prepared, and they were combined as listed in TABLE 11 and 12. In Comparative Examples 14 to 24, the temperature of the developing agent was set to 25° C. and the pH value thereof was set to 7.0, and in Comparative Examples 25 to 31, the temperature and pH value thereof were set to 40° C. and 9.0, respectively. The results of the evaluation were summarized in TABLES 11 and 12. TABLE 11 shows the results obtained in the case where the temperature and the pH value of the developing agent were set to 25° C. and 7.0, respectively, whereas TABLE 12 shows the results obtained in the case where the temperature and the pH value of the developing agent were set to 40° C. and 9.0, respectively.

TABLE 9

| | Composition number | | | | |
|---|---|---|---|---|---|
| Material | (i) | (ii) | (iii) | (iv) | (v) |
| Blue pigment | 27.0 | 27.0 | 27.0 | 27.0 | 27.0 |
| Dispersant 1 | 0.5 | 2.0 | 3.5 | 5.0 | — |
| Dispersant 2 | — | — | — | — | 3.5 |
| Dispersant/blue pigment | 0.019 | 0.074 | 0.130 | 0.185 | 0.130 |
| Pure water | 72.5 | 71.0 | 69.5 | 68 | 69.5 |

(in weight %)

Blue pigment: cobalt aluminate
Dispersant 1: ammonium salt of polyacrylic acid copolymer
Dispersant 2: sodium salt of polyacrylic acid copolymer

TABLE 10

| | Composition number | | | | | |
|---|---|---|---|---|---|---|
| Material | A | B | C | D | E | F |
| Blue phosphor | 40 | 40 | 40 | 40 | 40 | 40 |
| Ammonium | 0.16 | 0.10 | 0.06 | — | 0.16 | 0.16 |

TABLE 10-continued

| Material | Composition number | | | | | |
|---|---|---|---|---|---|---|
| | A | B | C | D | E | F |
| dichromate | | | | | | |
| Sodium dichromate | — | 0.06 | 0.10 | 0.16 | — | — |
| Sodium carbonate | — | — | — | — | 0.03 | 0.05 |
| Polyvinyl alcohol | 1.4 | 1.4 | 1.4 | 1.4 | 1.4 | 1.4 |
| Pure water | 54 | 54 | 54 | 54 | 54 | 54 |

(in weight ratio)

TABLE 11

| | | Components for constituting two layers | |
|---|---|---|---|
| | | Pigment dispersion solution | Phosphor dispersion solution |
| Examples | 19 | (i) | C |
| | 20 | (i) | D |
| | 21 | (i) | E |
| | 22 | (i) | F |
| | 23 | (ii) | B |
| | 24 | (ii) | C |
| | 25 | (ii) | D |
| | 26 | (ii) | E |
| | 27 | (ii) | F |
| | 28 | (iii) | B |
| | 29 | (iii) | C |
| | 30 | (iii) | D |
| | 31 | (iii) | E |
| | 32 | (iii) | F |
| | 33 | (iv) | B |
| | 34 | (iv) | C |
| | 35 | (iv) | D |
| | 36 | (iv) | E |
| | 37 | (iv) | F |
| Comparative Examples | 14 | (i) | B |
| | 15 | (i) | A |
| | 16 | (ii) | A |
| | 17 | (iii) | A |
| | 18 | (iv) | A |
| | 19 | (v) | A |
| | 20 | (v) | B |
| | 21 | (v) | C |
| | 22 | (v) | D |
| | 23 | (v) | E |
| | 24 | (v) | F |

| | | Properties | | |
|---|---|---|---|---|
| | | Dissolving-out | Adhesion | Peeling |
| Examples | 19 | ○ | Δ | ○ |
| | 20 | ○ | ○ | ○ |
| | 21 | ○ | Δ | Δ |
| | 22 | ○ | ○ | ○ |
| | 23 | ○ | Δ | ○ |
| | 24 | ○ | ○ | ○ |
| | 25 | ○ | ○ | ○ |
| | 26 | ○ | ○ | Δ |
| | 27 | ○ | ○ | ○ |
| | 28 | ○ | ○ | ○ |
| | 29 | ○ | ○ | ○ |
| | 30 | ○ | ○ | ○ |
| | 31 | ○ | ○ | ○ |
| | 32 | ○ | ○ | ○ |
| | 33 | ○ | ○ | ○ |
| | 34 | ○ | ○ | ○ |
| | 35 | ○ | ○ | ○ |

TABLE 11-continued

| | | | | |
|---|---|---|---|---|
| | 36 | ○ | ○ | ○ |
| | 37 | ○ | ○ | ○ |
| Comparative Examples | 14 | ○ | × | Δ |
| | 15 | ○ | × | Δ |
| | 16 | ○ | × | Δ |
| | 17 | ○ | × | Δ |
| | 18 | ○ | × | ○ |
| | 19 | × | ○ | ○ |
| | 20 | × | ○ | ○ |
| | 21 | × | ○ | ○ |
| | 22 | × | ○ | ○ |
| | 23 | × | ○ | ○ |
| | 24 | × | ○ | ○ |

TABLE 12

| | | Components for constituting two layers | |
|---|---|---|---|
| | | Pigment dispersion solution | Phosphor dispersion solution |
| Examples | 38 | (i) | B |
| | 39 | (i) | C |
| | 40 | (i) | D |
| | 41 | (i) | E |
| | 42 | (i) | F |
| | 43 | (ii) | A |
| | 44 | (ii) | B |
| | 45 | (ii) | C |
| | 46 | (ii) | D |
| | 47 | (ii) | E |
| | 48 | (ii) | F |
| | 49 | (iii) | A |
| | 50 | (iii) | B |
| | 51 | (iii) | C |
| | 52 | (iii) | D |
| | 53 | (iii) | E |
| | 54 | (iii) | F |
| | 55 | (iv) | A |
| | 56 | (iv) | B |
| | 57 | (iv) | C |
| | 58 | (iv) | D |
| | 59 | (iv) | E |
| | 60 | (iv) | F |
| Comparative Examples | 25 | (i) | A |
| | 26 | (v) | A |
| | 27 | (v) | B |
| | 28 | (v) | C |
| | 29 | (v) | D |
| | 30 | (v) | E |
| | 31 | (v) | F |
| | 24 | (v) | F |

| | | Properties | | |
|---|---|---|---|---|
| | | Dissolving-out | Adhesion | Peeling |
| Examples | 38 | ○ | Δ | ○ |
| | 39 | ○ | ○ | ○ |
| | 40 | ○ | ○ | ○ |
| | 41 | ○ | ○ | Δ |
| | 42 | ○ | ○ | ○ |
| | 43 | ○ | Δ | Δ |
| | 44 | ○ | ○ | ○ |
| | 45 | ○ | ○ | ○ |
| | 46 | ○ | ○ | ○ |
| | 47 | ○ | ○ | ○ |
| | 48 | ○ | ○ | ○ |
| | 49 | ○ | ○ | ○ |
| | 50 | ○ | ○ | ○ |
| | 51 | ○ | ○ | ○ |
| | 52 | ○ | ○ | ○ |
| | 53 | ○ | ○ | ○ |
| | 54 | ○ | ○ | ○ |

TABLE 12-continued

| | | | | |
|---|---|---|---|---|
| | 55 | ○ | ○ | ○ |
| | 56 | ○ | ○ | ○ |
| | 57 | ○ | ○ | ○ |
| | 58 | ○ | ○ | ○ |
| | 59 | ○ | ○ | ○ |
| | 60 | ○ | ○ | ○ |
| Comparative Examples | 25 | ○ | × | × |
| | 26 | × | ○ | ○ |
| | 27 | × | ○ | ○ |
| | 28 | × | ○ | ○ |
| | 29 | × | ○ | ○ |
| | 30 | × | ○ | ○ |
| | 31 | × | ○ | ○ |

Example 61

Of the filter-applied phosphor layers, a blue phosphor layer was formed on a plate glass.

As to the pigment dispersion solution and the phosphor slurry, the same materials as those in the Example 10 were used. The pigment dispersion solution was applied on a plate glass while maintaining the temperature of the plate glass at 30° C. Further, the panel was rotated at a speed of 100 to 150 rpm, and the excessive portion of the solution was shaken off. The pigment solution was dried by a heat wave having a temperature of 70° C. for 3 to 4 minutes, thus forming a blue pigment layer.

The phosphor slurry was applied on the glass surface on which the blue pigment layer was formed in the same manner as above. Then, the panel 10 was rotated at 150 to 230 rpm so as to shake off the excessive portion of the pigment dispersion solution. After that, the application layer was dried by a heater at a temperature of 70° C. for 2 to 3 minutes, thus obtaining a blue phosphor layer on the blue pigment layer.

The layers were exposed into a predetermined pattern via a mask by use of a high-pressure mercury lamp. A developing agent was sprayed at a developing agent pressure of 2 to 10 $kg/cm^2$ in a mist fashion, thus performing a development, and a blue-filter-applied blue phosphor layer having a predetermined pattern was formed.

The filter-applied phosphor layer thus obtained was evaluated by the same method as of Example 10, and the results of the evaluation were the same as those summarized in TABLE 7.

Example 62

Of the filter-applied phosphor layers, a red phosphor layer was formed on the inner surface of a face plate of a color cathode ray tube.

The red pigment dispersion solution was prepared by dispersing 25 weight % of fine particles of $Fe_2O_3$ (particle diameter: 0.01 $\mu$m to 0.02 $\mu$m), and 0.25 weight % of ammonium salt of polyoxyethylenealkylethersulfate (Hitenor 08 of Daiichi Kogyo Seiyaku Co. Ltd.) into pure water. The ratio of the polymer electrolyte concentration/the pigment concentration was set to 0.01.

The phosphor suspension solution (phosphor slurry) was prepared by mixing 40 g of red phosphor substance ($Y_2O_2S$:Eu), 0.16 g of sodium dichromate (SDC), 1.4 g of polyvinyl alcohol (average molecular weight: 2400, 88% of saponification) and 54 g of pure water, all of which were weighed.

A red-filter-applied red phosphor layer was obtained by the same method used in Example 10 by use of the above pigment dispersion solution and phosphor slurry.

The filter-applied phosphor layer thus obtained was evaluated by the same method as of Example 10, and the results of the evaluation were summarized in TABLE 13.

Examples 63 to 67

In each of these examples, a filter-applied phosphor layer was obtained with the same material and by the same method used in Example 62 except that the mixture ratio of the pigment dispersion solution was varied, and each phosphor layer was evaluated by the same method as that of Example 10.

The mixture ratios of the pigment dispersion solution and the results of the evaluation were summarized in TABLE 13.

Comparative Examples 32 to 33

In each of these examples, a red filter-applied red phosphor layer was obtained with the same material and by the same method used in Example 62 except that the mixture ratio between the polymer electrolyte concentration/the pigment concentration in the pigment dispersion solution was set to 0.003 (Comparative Example 32) and to 1.5 (Comparative Example 33.

Each of the filter-applied phosphor layer was evaluated by the same method as that of Example 10.

The mixture ratios of the pigment dispersion solution and the results of the evaluation were summarized in TABLE 13.

TABLE 13

| | | Composition of pigment dispersion solution | | | |
|---|---|---|---|---|---|
| | | Red pigment | Dispersant | Pure water | Ratio |
| Examples | 62 | 25.0 | 0.25 | 74.75 | 0.01 |
| | 63 | 25.0 | 0.13 | 74.87 | 0.005 |
| | 64 | 25.0 | 1.3 | 73.7 | 0.05 |
| | 65 | 25.0 | 25.0 | 50.0 | 0.10 |
| | 66 | 25.0 | 12.5 | 62.5 | 0.50 |
| | 67 | 25.0 | 25.0 | 50.0 | 1.00 |
| Comparative Examples | 32 | 25.0 | 0.08 | 74.92 | 0.003 |
| | 33 | 25.0 | 37.5 | 37.5 | 1.50 |

| | | Properties | | |
|---|---|---|---|---|
| | | Dissolving-out property | Adhesion property | Peeling property |
| Examples | 62 | ○ | ○ | ○ |
| | 63 | ○ | ○ | ○ |
| | 64 | ○ | ○ | ○ |
| | 65 | ○ | ○ | ○ |
| | 66 | Δ | Δ | ○ |
| | 67 | Δ | Δ | ○ |
| Comparative Examples | 32 | ○ | ○ | × |
| | 33 | × | Δ | ○ |

(in weight %)

Red pigment: $Fe_2O_3$
Dispersant: Ammonium salt of polyoxyethylenealkylether sulfate
Ratio: Ratio between dispersant/red pigment

Example 68

In this example, a red-filter-applied red phosphor layer was prepared with the same materials and method as those of Example 62 except that $Y_2O_3$:Eu was used as the red phosphor substance.

The filter-applied phosphor layer thus obtained was evaluated by the same method as of Example 62, and substantially the same results as those of Example 62 were obtained. Further, red-filter-applied red phosphor layers were prepared with various amounts of dispersant as in Examples 63 to 67, and they were evaluated. The results of the evaluation were the same as those summarized in TABLE 13.

Example 69

Of the filter-applied phosphor layers, a green phosphor layer was formed on the inner surface of a face plate of a color cathode ray tube.

The pigment dispersion solution was prepared by dispersing 30 weight % of $TiO_2$-NiO-CoO-ZnO (Dypyroxide TM-Green #3320, particle diameter: 0.01 $\mu$m to 0.02 $\mu$m, DAINICHI SEIKA Inc.) and 0.3 weight % of ammonium salt of polyacrylic acid copolymer (Dispex GA-40, Allied Colloid Inc.) into pure water. The ratio of the polymer electrolyte concentration/the pigment concentration was set to 1/100.

The phosphor suspension solution (phosphor slurry) was prepared by mixing 40 g of green phosphor substance ($Y_2O_2S$:Eu), 0.16 g of sodium dichromate (SDC), 1.4 g of polyvinyl alcohol (average molecular weight: 2400, 88% of saponification) and 54 g of pure water, all of which were weighed.

A green-filter-applied green phosphor layer was obtained by the same method used in Example 10 by use of the above pigment dispersion solution and phosphor slurry.

The filter-applied phosphor layer thus obtained was evaluated by the same method as of Example 10, and the results of the evaluation were the same as of Example 10.

Example 70

In this example, on the inner surface of the face plate of a color cathode ray tube, a blue-filter-applied blue phosphor layer was formed by the same method as that of Example 10, followed by the formation of a red-filter-applied red phosphor layer by the same method as that of Example 62 and a green-filter-applied green phosphor layer by the same method as that of Example 69. These layers were patterned, thus obtaining a blue/red/green filter-applied phosphor two-layer pattern. In the formation of each color pattern, and at an intermediate portion between colors, two-layer pattern having a good dissolving property was obtained in a wide range of work. Further, the color cathode ray tube thus obtained exhibited a good contrast and color purity.

As is clear from Examples 10 to 70, according to the present invention, in the step of forming or developing, for example, a phosphor layer, which is obtained by applying a solution of salt of polymer electrolyte, containing pigment particles, on a substrate, and dissociating at least the salt of the polymer electrolyte salt partially, followed by drying, another solution containing a substance which can form a salt with a partially dissociated polymer electrolyte salt, is used. With this constitution, in the case where patterning is carried out on a multi-layer by one exposure, the two contradicting properties, namely, the dissolving out property and the developing property, can be satisfied at the same time.

Consequently, a cathode ray tube and a filter-applied phosphor layer of a color image receiving apparatus, each of which has a good contrast and a color purity, can be obtained at a wide range of work condition.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a display screen having a filter pattern, the method comprising the steps of:

forming a coating film having two layers on a substrate, at least an upper layer of said two layers being a photoresist, and a lower layer of two layers being a filter layer formed by applying a pigment dispersion solution containing pigment particles and an anionic polymer followed by drying;

exposing the coating film via a mask pattern;

patterning the film by developing with an alkali solution.

2. A method according to claim 1, wherein said anionic polymer is selected from the group consisting of ammonium salts and amine salts of acrylic acid or acrylic acid-styrene copolymers, polymer polycarboxylic acids, styrene-polycarboxylic acid copolymers, aromatic formalin sulfonate condensation product, polyoxyethylenealkylether sulfate, and polyoxyethylene alkylphenylether sulfate.

3. A method according to claim 2, wherein said anionic polymer is an ammonium salt of an acrylate polymer or acrylate copolymer.

4. A method according to claim 1, wherein said upper layer contains a substance, which forms a salt with said anionic polymer, selected from the group consisting of a salt of an alkali metal and a hydroxide of a metal.

5. A method according to claim 4, wherein the substance which forms a salt with the anionic polymer is at least one selected from the group consisting of LiCl, $LiNO_3$, NaCL, $Na_2CO_3$, $Na_2S_2O_3$, NaOH and sodium dichrominate.

6. A method according to claim 5, wherein the substance which forms a salt with the anionic polymer is sodium dichrominate.

7. A method according to claim 1, wherein a concentration of the pigment particles in the pigment dispersion solution is in the range of 0.1 weight % to 50 weight %.

8. A method according to claim 1, wherein a weight, ratio of a concentration of the polymer with respect to the concentration of the pigment particles in the pigment dispersion solution is in a range of 0.005 to 1.

9. A method according to claim 1, wherein said developing agent contains a substance which forms a salt with the polymer.

* * * * *